United States Patent
Numata

(10) Patent No.: US 10,051,213 B2
(45) Date of Patent: Aug. 14, 2018

(54) SOLID-STATE IMAGE SENSOR, RANGING APPARATUS AND IMAGING APPARATUS WITH PIXELS HAVING IN-PIXEL MEMORIES

(71) Applicant: CANON KABUSHIKI KAISHA, Tokyo (JP)

(72) Inventor: Aihiko Numata, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/111,242

(22) PCT Filed: Jan. 21, 2015

(86) PCT No.: PCT/JP2015/000268
§ 371 (c)(1),
(2) Date: Jul. 13, 2016

(87) PCT Pub. No.: WO2015/115066
PCT Pub. Date: Aug. 6, 2015

(65) Prior Publication Data
US 2016/0337608 A1    Nov. 17, 2016

(30) Foreign Application Priority Data

Jan. 28, 2014 (JP) .................. 2014-013377
Sep. 16, 2014 (JP) .................. 2014-187752
Sep. 16, 2014 (JP) .................. 2014-187753

(51) Int. Cl.
*H04N 5/353* (2011.01)
*H04N 5/369* (2011.01)
(Continued)

(52) U.S. Cl.
CPC ......... *H04N 5/3532* (2013.01); *H04N 5/2329* (2013.01); *H04N 5/3456* (2013.01);
(Continued)

(58) Field of Classification Search
CPC ............ H04N 5/37452; H04N 5/3575; H04N 5/35563; H04N 5/2329; H04N 5/23245;
(Continued)

(56) References Cited

U.S. PATENT DOCUMENTS 9,040,888 B2    5/2015    Numata
9,160,942 B2    10/2015   Numata
(Continued)

FOREIGN PATENT DOCUMENTS

| JP | 2007-065330 A | 3/2007 |
| JP | 2007-243744 A | 9/2007 |

OTHER PUBLICATIONS

Aihiko Numata, U.S. Appl. No. 15/111,250, filed Jul. 13, 2016.
(Continued)

*Primary Examiner* — Gevell Selby
(74) *Attorney, Agent, or Firm* — Fitzpatrick, Cella, Harper & Scinto

(57) ABSTRACT

A solid-state image sensor includes first and second ranging pixels that detect an incident light beam in the solid-state image sensor by separating the incident light beam in a first and second direction, respectively. The angle between the second direction and a column direction is smaller than the angle between the first direction and the column direction. A difference in exposure timings of second ranging pixels disposed in different rows is made smaller than that of first ranging pixels disposed in different rows, by causing to vary, for each row, a time over which charge is held in the in-pixel memories, in the plurality of second ranging pixels disposed in different rows.

16 Claims, 30 Drawing Sheets

(51) Int. Cl.
*H04N 5/345* (2011.01)
*H04N 5/232* (2006.01)
*H04N 5/3745* (2011.01)
*H04N 5/355* (2011.01)
*G02B 7/34* (2006.01)
*H04N 5/357* (2011.01)
*H04N 5/361* (2011.01)
*H01L 27/146* (2006.01)

(52) U.S. Cl.
CPC ............. *H04N 5/3696* (2013.01); *G02B 7/34* (2013.01); *H01L 27/14623* (2013.01); *H01L 27/14629* (2013.01); *H01L 27/14641* (2013.01); *H01L 27/14643* (2013.01); *H04N 5/23245* (2013.01); *H04N 5/3575* (2013.01); *H04N 5/35554* (2013.01); *H04N 5/35563* (2013.01); *H04N 5/361* (2013.01); *H04N 5/3745* (2013.01); *H04N 5/37452* (2013.01)

(58) Field of Classification Search
CPC .... H04N 5/3745; H04N 5/361; H04N 5/3456; H04N 5/35554; H04N 5/3532; H04N 5/369; H01L 27/14629; H01L 27/14623; H01L 27/14641; H01L 27/14643
See application file for complete search history.

(56) References Cited

U.S. PATENT DOCUMENTS

| | | | |
|---|---|---|---|
| 9,307,170 | B2 | 4/2016 | Numata |
| 9,319,607 | B2 | 4/2016 | Numata |
| 9,402,041 | B2 | 7/2016 | Numata |
| 2007/0171298 | A1* | 7/2007 | Kurane ............... H04N 5/2353 348/362 |
| 2011/0228127 | A1* | 9/2011 | Nakagawa ......... H04N 5/23216 348/222.1 |
| 2013/0063642 | A1 | 3/2013 | Nakaoka |
| 2013/0214128 | A1* | 8/2013 | Yamashita ........... H04N 5/3696 250/208.1 |
| 2015/0181108 | A1* | 6/2015 | Endo .................. H04N 5/23212 348/345 |

OTHER PUBLICATIONS

Aihiko Numata, U.S. Appl. No. 15/215,832, filed Jul. 21, 2016.
International Preliminary Report on Patentability issued in International Application No. PCT/JP2015/000268 dated Aug. 11, 2016.
International Search Report and Written Opinion issued in International Application No. PCT/JP2015/000268 dated Mar. 27, 2015.

* cited by examiner

FIG. 3A
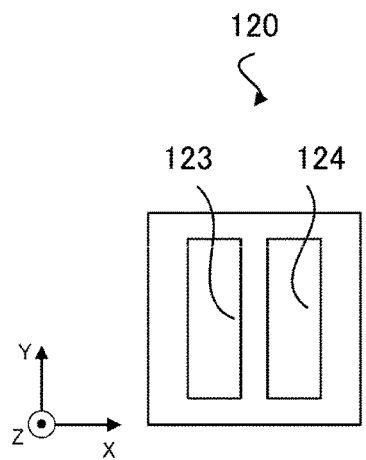
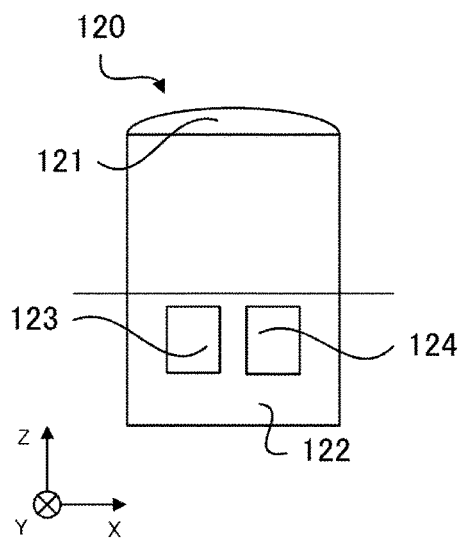
FIG. 3B
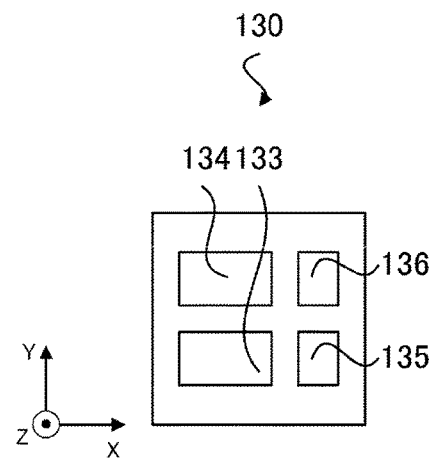
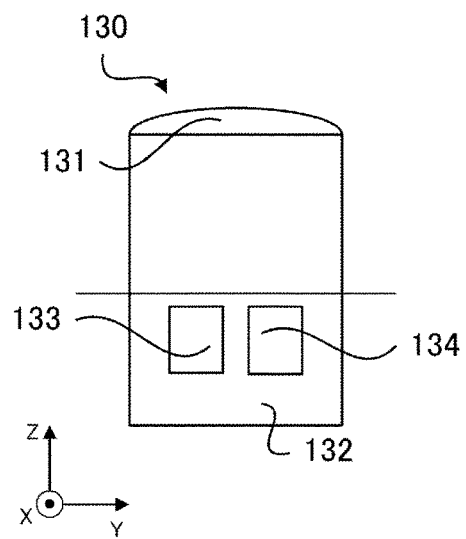

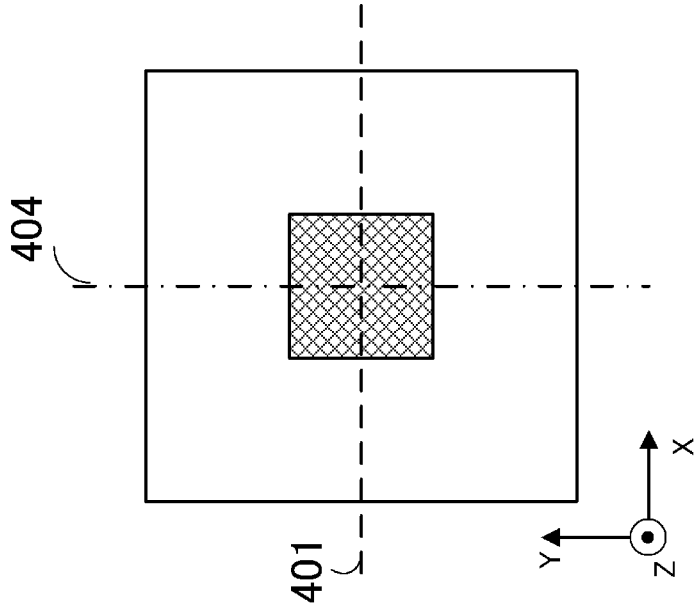
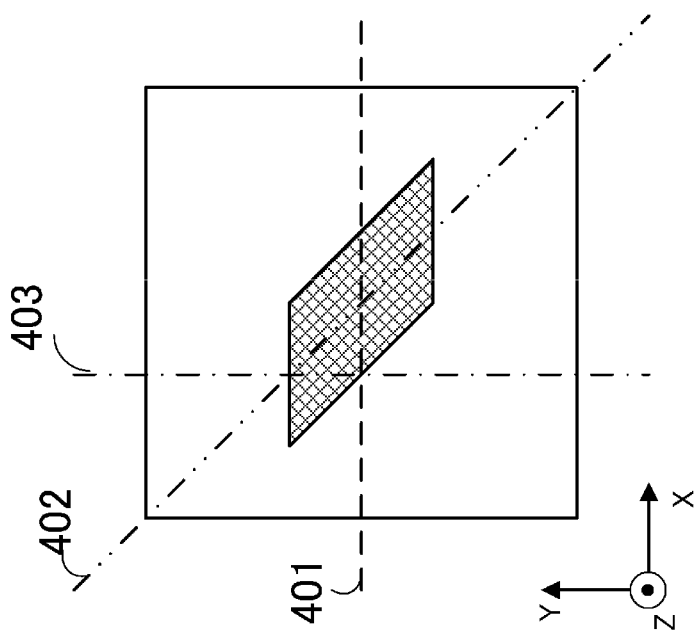

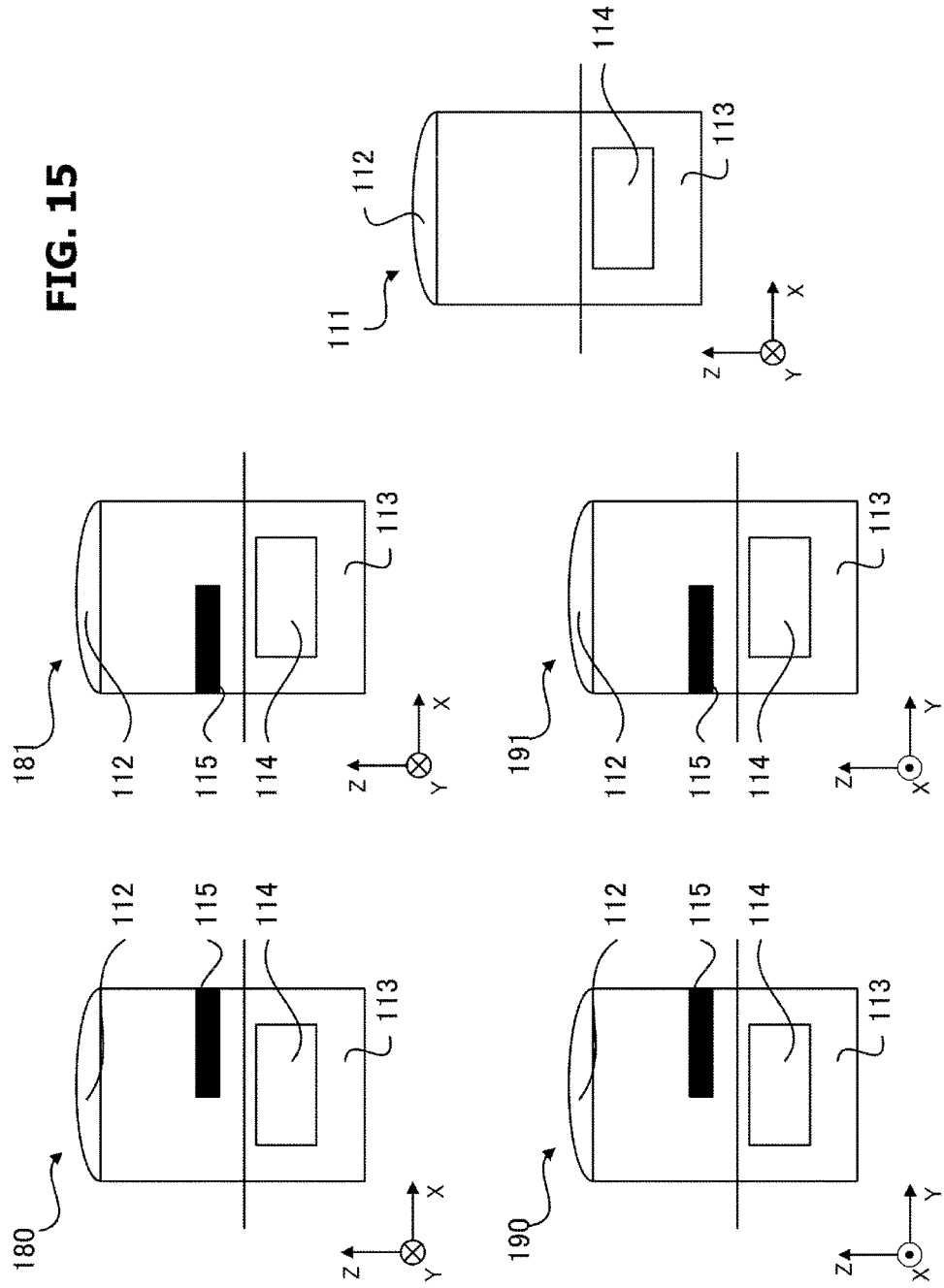

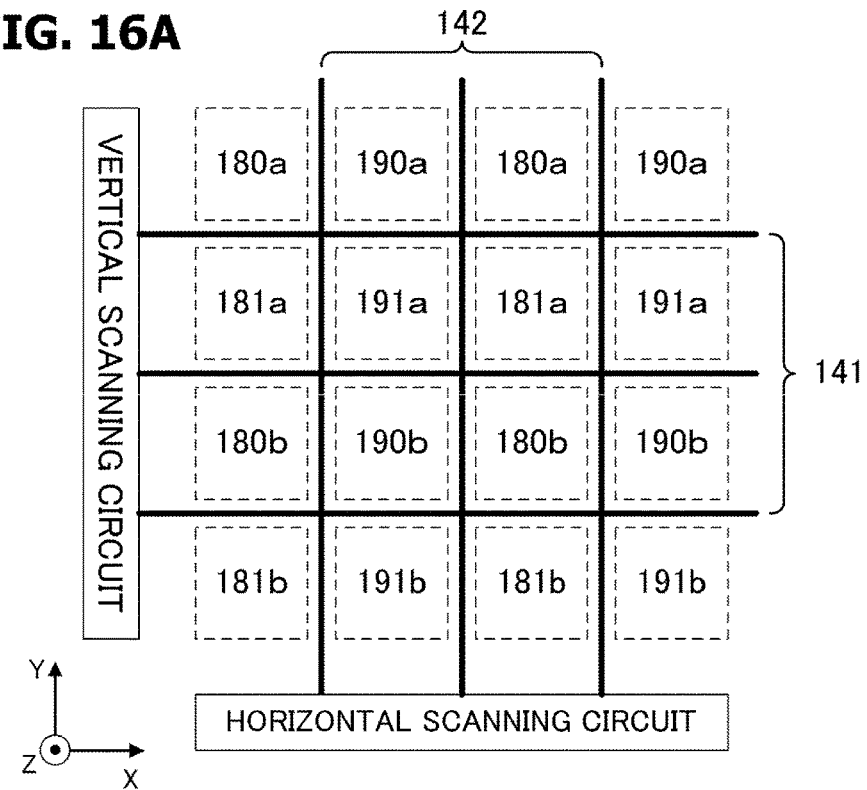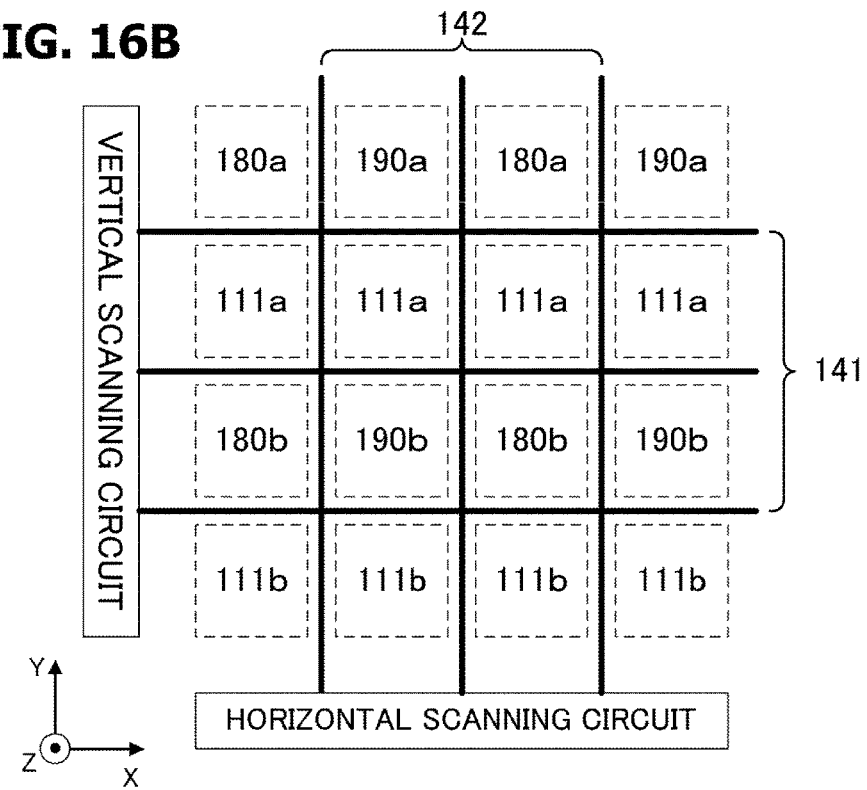

FIG. 25
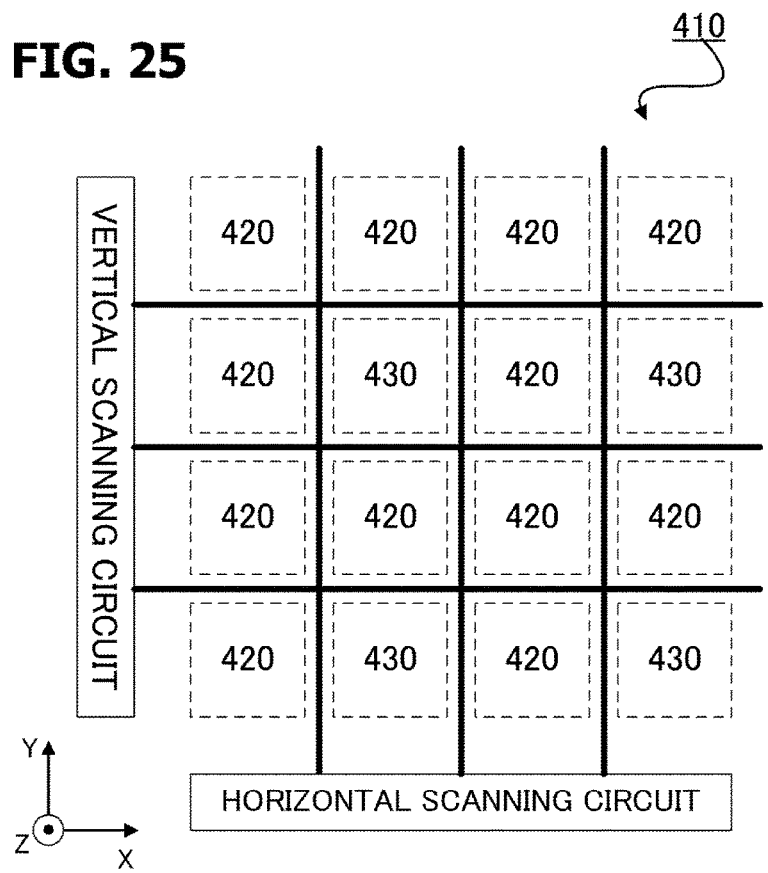
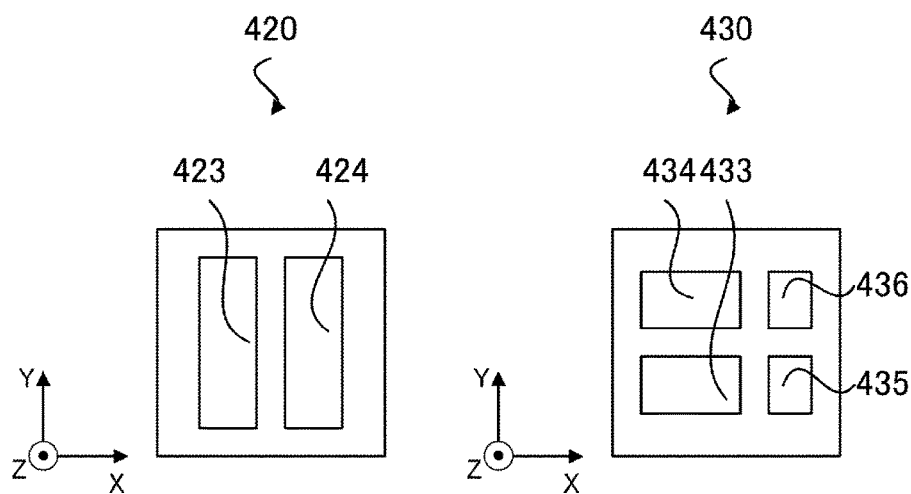

SOLID-STATE IMAGE SENSOR, RANGING APPARATUS AND IMAGING APPARATUS WITH PIXELS HAVING IN-PIXEL MEMORIES

TECHNICAL FIELD

The present invention relates to a solid-state image sensor, and more particularly, to a solid-state image sensor that is used for ranging in imaging apparatuses such as digital still cameras and digital video cameras.

BACKGROUND ART

In recent years, solid-state image sensors of CMOS type in which MOS transistors are utilized in pixel amplifier sections have come to be widely used in digital still cameras and video cameras. Signal transfer methods in CMOS-type solid-state image sensors include two known methods, as follows. The first method is a so-called rolling shutter scheme that involves transferring voltage signals of pixels to a vertical signal line, sequentially for each row. In such a rolling shutter scheme, the timings of signal transfer are offset for each row, and hence the exposure timings are likewise offset for each row. The second method is a so-called global shutter scheme that involves holding charge temporarily in in-pixel memories, to render simultaneous thereby the exposure timings of all pixels.

Solid-state image sensors have also been proposed wherein some or all of the pixels in an imaging element are configured in the form of pixels for distance measurement (hereafter, ranging pixels), to enable distance detection relying on a phase difference scheme. The phase difference scheme is a method that involves comparing images of light having passed through different regions on a pupil of an imaging optical system, and detecting distance through triangulation according to a stereo image. As a result, high-speed high-precision ranging is made possible since, unlike in conventional contrast methods, no lens need be moved in order to measure distance. Further, the signals acquired in the ranging pixels can be used as image signals for generating a captured image; and, accordingly, ranging can thus be performed simultaneously with imaging.

Patent literature 1 discloses a solid-state image sensor wherein the exposure timings upon ranging at all the ranging pixels of a solid-state image sensor can be rendered simultaneous by utilizing global shutter in the solid-state image sensor.

Patent literature 2 discloses a solid-state image sensor that is capable of high-precision ranging, regardless of the texture direction of a subject, by providing a plurality of types of ranging pixels having mutually different pupil division directions. Specifically, the pupil division direction is modified by varying the arrangement of photoelectric conversion units within the ranging pixels.

CITATION LIST

Patent Literature

[PTL 1]
Japanese Patent Application Publication No. 2007-243744
[PTL 2]
Japanese Patent Application Publication No. 2007-065330

SUMMARY OF INVENTION

Technical Problem

The problems below arise in a case where rolling shutter is utilized in a solid-state image sensor that is provided with a plurality of types of ranging pixel having mutually different pupil division directions, as in Patent literature 2. In a case where ranging is performed using ranging pixels that perform pupil division in a direction different from the row direction, ranging is carried out using brightness value changes of the subject across different rows. As described above, however, exposure timings in rolling shutter are offset for each row, and, accordingly, changes in brightness value across different rows reflect a subject with offset in exposure timing. As a result, ranging precision decreases, in particular when imaging a subject that is moving at high speed.

The problems below arise in a case where global shutter such as the one disclosed in Patent literature 1 is utilized in a solid-state image sensor that is provided with a plurality of types of ranging pixels having mutually different pupil division directions, as disclosed in Patent literature 1. Global shutter requires in-pixel memories that hold charge temporarily. As a result, the aperture ratio of the photoelectric conversion units that acquire light from the subject decreases, and particularly there is a drop in ranging precision for a dark subject.

In view of the above problems, it is an object of the present invention to provide a solid-state image sensor that is capable of high-precision ranging regardless of the subject.

Solution to Problem

A solid-state image sensor according to a first aspect of the present invention is a solid-state image sensor having a plurality of pixels disposed in the form of a matrix, and acquiring signals of respective pixels in a unit of row, wherein the solid-state image sensor is configured in such a manner that first ranging pixels that detect an incident light beam toward the solid-state image sensor by separating the incident light beam in a first direction, and second ranging pixels that detect an incident light beam toward the solid-state image sensor by separating the incident light beam in a second direction, an angle between the second direction and a column direction being smaller than an angle between the first direction and the column direction, are disposed in the form of a matrix; and the second ranging pixels have in-pixel memories, such that a difference in exposure timings of a plurality of second ranging pixels disposed in mutually different rows is made smaller than a difference in exposure timings of a plurality of first ranging pixels disposed in mutually different rows, by causing to vary, for each row, a time over which charge is held in the in-pixel memories, between second ranging pixels disposed in different rows.

A solid-state image sensor according to a second aspect of the present invention is a solid-state image sensor having a plurality of pixels disposed in the form of a matrix and acquiring signals of respective pixels are acquired in a unit of row, wherein at least some of the plurality of pixels are ranging pixels including an in-pixel memory and being capable of operating in a first ranging mode of detecting an incident light beam toward the solid-state image sensor by separating the incident light beam in a first direction, and a second ranging mode of detecting an incident light beam toward the solid-state image sensor by separating the incident light beam in a second direction, an angle between the second direction and a column direction being smaller than an angle between the first direction and the column direction, a difference in exposure timings of ranging pixels that are disposed in different rows and that operate in the second ranging mode is made smaller than a difference in the exposure timing of ranging pixels that are disposed in different rows and that operate in the first ranging mode, by causing to vary, for each row, a time over which charge is held in the in-pixel memories, in a plurality of ranging pixels disposed in different rows.

Advantageous Effects of Invention

The present invention succeeds in providing a solid-state image sensor capable of high-precision ranging regardless of the subject.

Further features of the present invention will become apparent from the following description of exemplary embodiments with reference to the attached drawings.

BRIEF DESCRIPTION OF DRAWINGS

FIGS. 3A, 3B illustrate ranging pixels according to Embodiment 1.

FIGS. 4A, 4B illustrate images acquired with rolling shutter and global shutter.

FIG. 15 illustrates variations of a ranging pixel.

FIGS. 16A, 16B illustrate arrangements of ranging pixels.

FIG. 25 illustrates a solid-state image sensor according to Embodiment 4.

DESCRIPTION OF EMBODIMENTS

A solid-state image sensor of an embodiment of the present invention will be explained next with reference to accompanying drawings. In all drawings, elements having identical functions are denoted by the same reference symbols, and a recurrent explanation thereof will be omitted.

Embodiment 1

Ranging Apparatus

Figure 1:
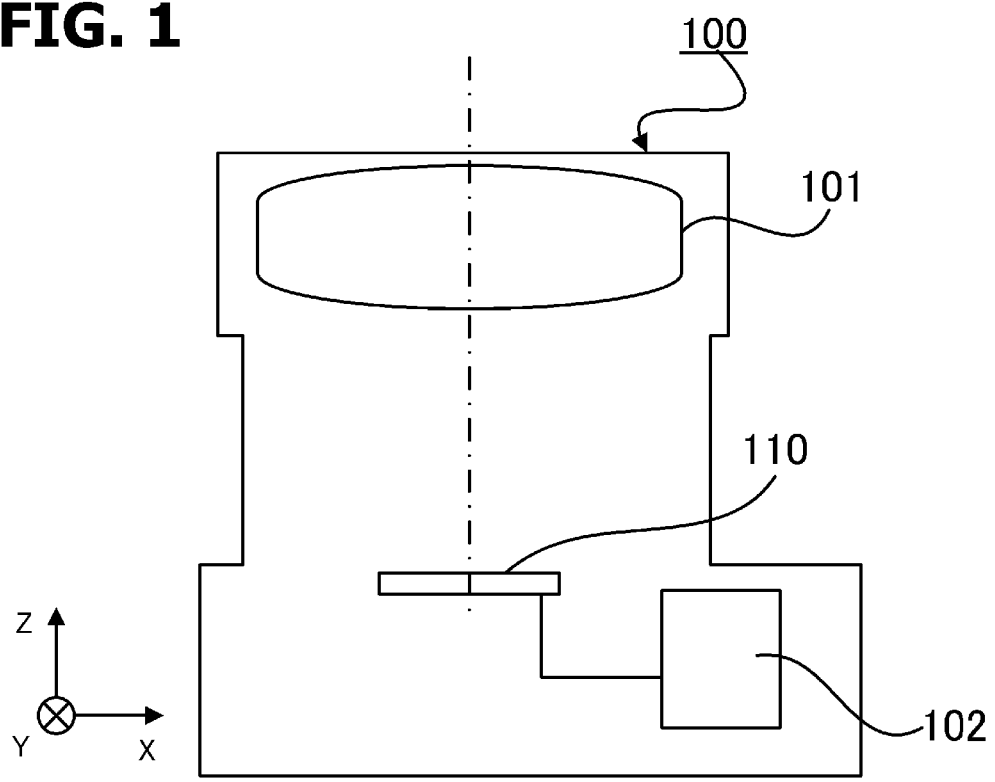
FIG. 1 illustrates a ranging apparatus according to Embodiment 1.

FIG. 1 is a schematic diagram of a ranging apparatus that utilizes a solid-state image sensor of the present invention. In FIG. 1, a ranging apparatus 100 comprises an imaging optical system 101, a solid-state image sensor 110 and a processing unit 102. The solid-state image sensor 110 is disposed on the optical axis (chain line) of the imaging optical system 101. The imaging optical system 101 forms a subject image on the solid-state image sensor 110.

The processing unit 102 comprises a CPU, a DSP and a memory that stores a program, and performs various signal processing items through execution of the program. Examples of processing performed by the processing unit 102 include, for instance, subject distance detection, subject image acquisition. The various instances of signal processing in the explanation below are performed by the processing unit 102. The imaging apparatus is made up of the ranging apparatus and an imaging function (subject image acquisition unit) of the processing unit 102. Known techniques can be utilized in the subject image acquisition function of the processing unit 102, and will therefore not be explained in detail in the present description.

<Solid-State Image Sensor>

Figure 2:
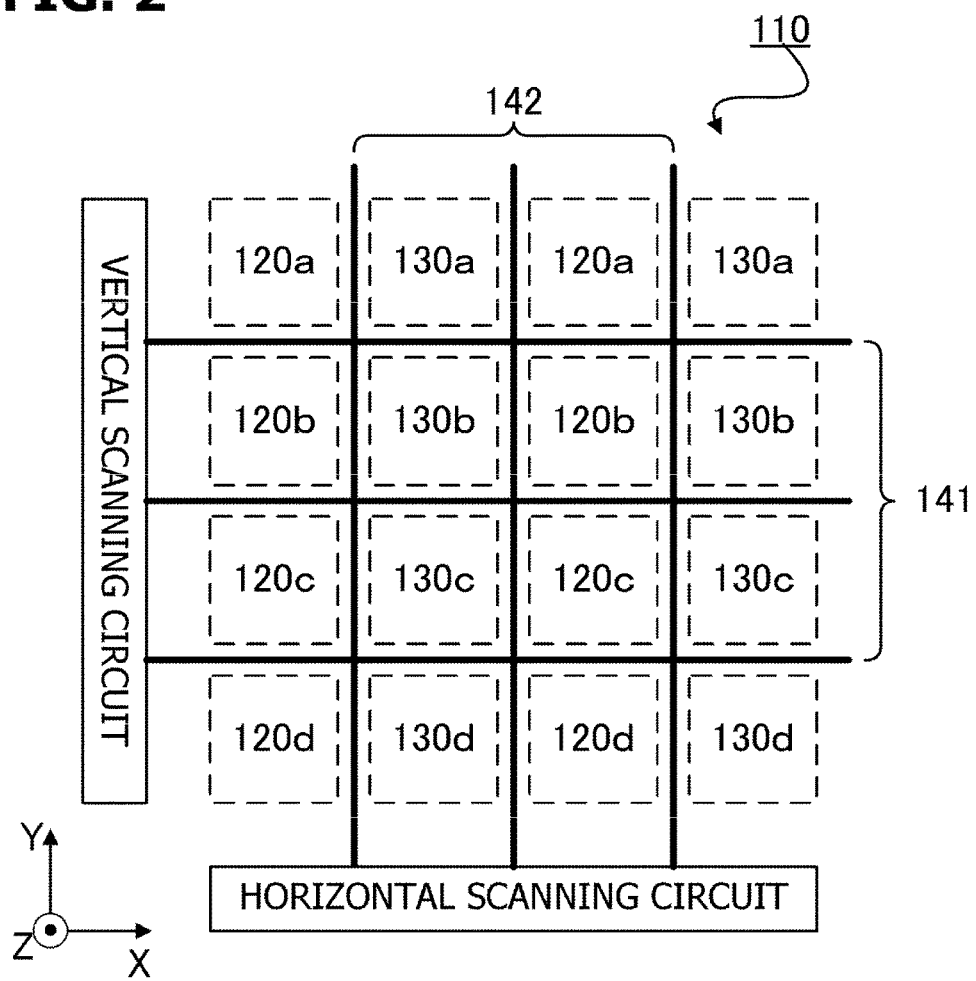
FIG. 2 illustrates a solid-state image sensor according to Embodiment 1.

FIG. 2 is a schematic diagram illustrating the solid-state image sensor 110 of the present invention. The solid-state image sensor 110 has two kinds of ranging pixels 120, 130 disposed as a plurality thereof in the form of a matrix, and a peripheral circuit for reading signals from the ranging pixels. For simplicity, FIG. 2 illustrates an instance of 4×4 pixels, but the configuration of the solid-state image sensor 110 is not limited thereto.

The peripheral circuit has connected horizontal driving lines 141 in order to drive transistors, and vertical signal lines 142 that read signals from the pixels. The pixels, which are driven by respective horizontal driving lines 141, output signals to the vertical signal lines 142. The signals from the pixels of the solid-state image sensor 110 are thus acquired in row units (for each row).

The first ranging pixels 120 are pixels that acquire a subject image through division of a pupil of the imaging optical system 101 in the X direction (also referred to as row direction or first direction). The second ranging pixels 130 are pixels that acquire a subject image through division of the pupil of the imaging optical system 101 in the Y direction (column direction or second direction). The ranging pixels 120 and the ranging pixels 130 are disposed in alternately different columns. To differentiate among the ranging pixels 120 (130) of the various rows, the pixels will be referred to as ranging pixels 120 (130)a, ranging pixels 120 (130)b, ranging pixels 120 (130)c and ranging pixels 120 (130)d, as illustrated in FIG. 2.

<Ranging Pixels>

FIG. 3(a) is a schematic diagram illustrating a pixel internal configuration of the ranging pixels 120, and FIG. 3(b) is a schematic diagram illustrating the pixel internal configuration of the ranging pixels 130. The ranging pixels 120 (130) each have a micro-lens 121 (131) and a substrate 122 (132), from the light incidence side. Two photoelectric conversion units 123, 124 lined up in the X direction are formed within the substrate 122 of each of the ranging pixels 120. Two photoelectric conversion units 133, 134 lined up in the Y direction are formed within the substrate 132 of each of the ranging pixels 130. The micro-lens 121 (131) is disposed astride the photoelectric conversion units 123 and 124 (133 and 134). The micro-lens 121 selectively guides, to the photoelectric conversion unit 123, a light beam that is incident from a pupil region, eccentric in the +X direction, and selectively guides, to the photoelectric conversion unit 124, a light beam that is incident through a pupil region eccentric in the −X direction, within the exit pupil of the imaging optical system 101. Similarly, the micro-lens 131 selectively guides, to the photoelectric conversion unit 133, a light beam that is incident from a pupil region, eccentric in the +Y direction, and selectively guides, to the photoelectric conversion unit 134, a light beam that is incident through a pupil region eccentric in the −Y direction, within the exit pupil of the imaging optical system 101. That is, the ranging pixels 120 are configured in such a manner that an incident light beam from the imaging optical system is detected separated in the X direction (row direction), and the ranging pixels 130 are configured in such a manner that an incident light beam from the imaging optical system is detected separated in the Y direction (column direction).

In-pixel memories 135 and 136 formed by ion implantation or the like are provided in each of the ranging pixels 130. In the ranging pixels 130, pixel signals are acquired with global shutter, through temporary holding of charge in the memories 135 and 136. In the ranging pixels 120, by contrast, pixel signals are acquired according to rolling shutter. The aperture ratio of the photoelectric conversion units 123, 124 of the ranging pixels 120 is greater than the aperture ratio of the photoelectric conversion units 133, 134 of the ranging pixels 130, by the extent that the in-pixel memories 135, 136 are absent in the photoelectric conversion units 123, 124.

The ranging pixels 120 and 130 are provided with horizontal driving lines 141 and vertical signal lines 142, and transistors, such that pixel signals acquired from respective photoelectric conversion units are transferred to the peripheral circuit. The specific charge transfer operation will be explained further on.

The micro-lenses 121 and 131 are formed of $SiO_2$, SiN, or the like, which are transparent materials at the detection wavelength band. The substrates 122 and 132 are formed of a material such as Si or an organic semiconductor that exhibits absorption at the detection wavelength band. The wiring 141 and 142 is formed of a metal such as Al or Cu.

<Comparison with a Conventional Example: Problems of Rolling Shutter>

In the solid-state image sensor 110, the ranging pixels 130 operate with global shutter, whereas the ranging pixels 120 operate with rolling shutter. Accordingly, high-precision ranging is enabled regardless of the subject. The reasons for this are explained below.

FIG. 4(a) and FIG. 4(b) are diagrams for explaining an image that is acquired in the case of a square subject that is moving at high speed towards the X direction. FIG. 4(a) is an image acquired with rolling shutter, and FIG. 4(b) is an image acquired with global shutter. When rolling shutter is resorted to, there is an offset in the exposure timings between different rows, and as a result the image is acquired as a line image where the sides of the square in the Y direction (column direction) extend obliquely. By contrast, the exposure timings between pixels along the X direction (row direction) are simultaneous, and hence the image is acquired in the form of a line image where the sides in the row direction extend in the row direction. When global shutter is resorted to, the exposure timings of all pixels are simultaneous, and accordingly a square image is acquired that reflects the shape of the subject.

Upon use of the ranging pixels 120, ranging is performed by detecting a shift (image shift amount) between an image (A image) 151 acquired by the photoelectric conversion unit 123, and an image (B image) 152 acquired by the photoelectric conversion unit 124, for a brightness value change along the row direction of the subject image. As described above, the exposure timings in the row direction are simultaneous even in a case where rolling shutter is utilized, and in consequence the brightness value change in the row direction (direction of the dashed line 401 in FIG. 4) reflects the subject acquired at a same point in time. Accordingly, the drop in ranging precision is small, using the ranging pixels 120, regardless of whether rolling shutter or global shutter is resorted to, in the case of ranging of a subject that is moving at high speed.

Upon use of the ranging pixels 130, on the other hand, ranging is performed by detecting a shift (image shift amount) between an image (C image) 153 acquired by the photoelectric conversion unit 133, and an image (D image) 154 acquired by the photoelectric conversion unit 134, for a brightness value change along the column direction of the subject image. When rolling shutter is resorted to, there is an offset in the exposure timings between different rows, as described above; accordingly, the direction that reflects the subject at a same point in time is the direction of two-dot chain line 402 in FIG. 4(a). Specifically, the brightness value change along the column direction (direction of chain line 403 in FIG. 4(a)) does not reflect a subject image that is acquired at a same point in time. When global shutter is resorted to, by contrast, the brightness value change along the column direction (direction of chain line 404 in FIG. 4(b)) reflects a subject image acquired at a same point in time. Therefore, although ranging precision decreases when utilizing rolling shutter in the case of ranging of a subject that is moving at high speed, using the ranging pixels 130, such a drop in ranging precision is small if global shutter is resorted to.

The extent of decrease in ranging precision of a case where a subject that is moving at high speed is imaged with rolling shutter varies thus depending on the separation direction of an incident light beam in the ranging pixels. In the above explanation, the subject is postulated to be moving at high speed in the X direction, but the motion direction of the subject and the decrease in ranging precision are unrelated. The X-direction length of the subject image does not change, but the Y-direction length expands and contracts in a case where a subject moving at high speed in the Y direction is imaged with rolling shutter. Therefore, an error arises in the obtained image shift amount, and ranging precision decreases, when rolling shutter is utilized in the ranging pixels 130. By contrast, the drop in ranging precision is small in the ranging pixels 120, even if rolling shutter is utilized. That is, the relationship with drop in ranging precision is the relationship between the separation direction of an incident light beam and the X, Y directions. Therefore, the extent of decrease of ranging precision differs depending on the separation direction of an incident light beam for ranging pixels that utilize brightness value changes in an oblique direction, also in cases other than when using ranging pixels that utilize brightness value changes in the X direction and the Y direction, as described above. The exposure timings of pixels along the column direction are offset from each other, as described above, and, accordingly, the extent of decrease of ranging precision by a light beam for a moving subject becomes larger as there increases the number of ranging pixels that separate an incident light beam in a direction that forms a small angle with the column direction. Conversely, the extent of decrease of ranging precision for a moving subject moving at high speed becomes smaller as there increases the number of ranging pixels that separate an incident light beam in a direction that forms a large angle with the column direction.

In the solid-state image sensor 110 global shutter is utilized in the ranging pixels 130 that separate an incident light beam in the Y direction. That is because the extent of decrease of ranging precision for a subject that is moving at high speed is greater when utilizing rolling shutter for the ranging pixels 130. On the other hand, rolling shutter is resorted to in the ranging pixels 120 that separate an incident light beam in the X direction. That is because the extent of decrease of ranging precision is small, even if the subject is moving at high speed, in the ranging pixels 120. It becomes thus possible to enhance the ranging precision for a subject that is moving at high speed, without utilizing global shutter for all the ranging pixels.

<Comparison with a Conventional Example: Problems of Global Shutter>

In terms of enhancing ranging precision, it would conceivably suffice to utilize global shutter for all ranging pixels. However, utilizing global shutter for all ranging pixels gives rise to the following problems. In order to perform the global shutter operation, a memory is necessary in order to hold temporarily charge within each pixel. Arranging a memory entails a smaller aperture ratio of the photoelectric conversion units, and also limitations in the arrangement of transistors and wiring. A reduction in the aperture ratio of the photoelectric conversion units translates into lower sensitivity of the ranging pixels, and into lower ranging precision for a dark subject. Limitations in the arrangement of transistors and wiring result in poorer manufacturing yield. Further, the number of transistors may have to be reduced in cases where such arrangement limitations are severe. A reduction in the number of transistors entails, for instance, greater circuit noise, which translates into poorer ranging precision. The charge transfer operation is larger in global shutter than in rolling shutter, and power consumption is accordingly larger as well.

Thus, implementing global shutter for all ranging pixels gives rise to the problems of lower ranging precision, lower yield, and greater power consumption. By utilizing global shutter only in the ranging pixels 130 in the present embodiment, it becomes possible to achieve, for instance, enhanced ranging precision for a dark subject, enhanced yield, and lower power consumption, while enhancing ranging precision for an object moving at high speed.

<Circuit Diagram and Operation Flow>

Figure 5:
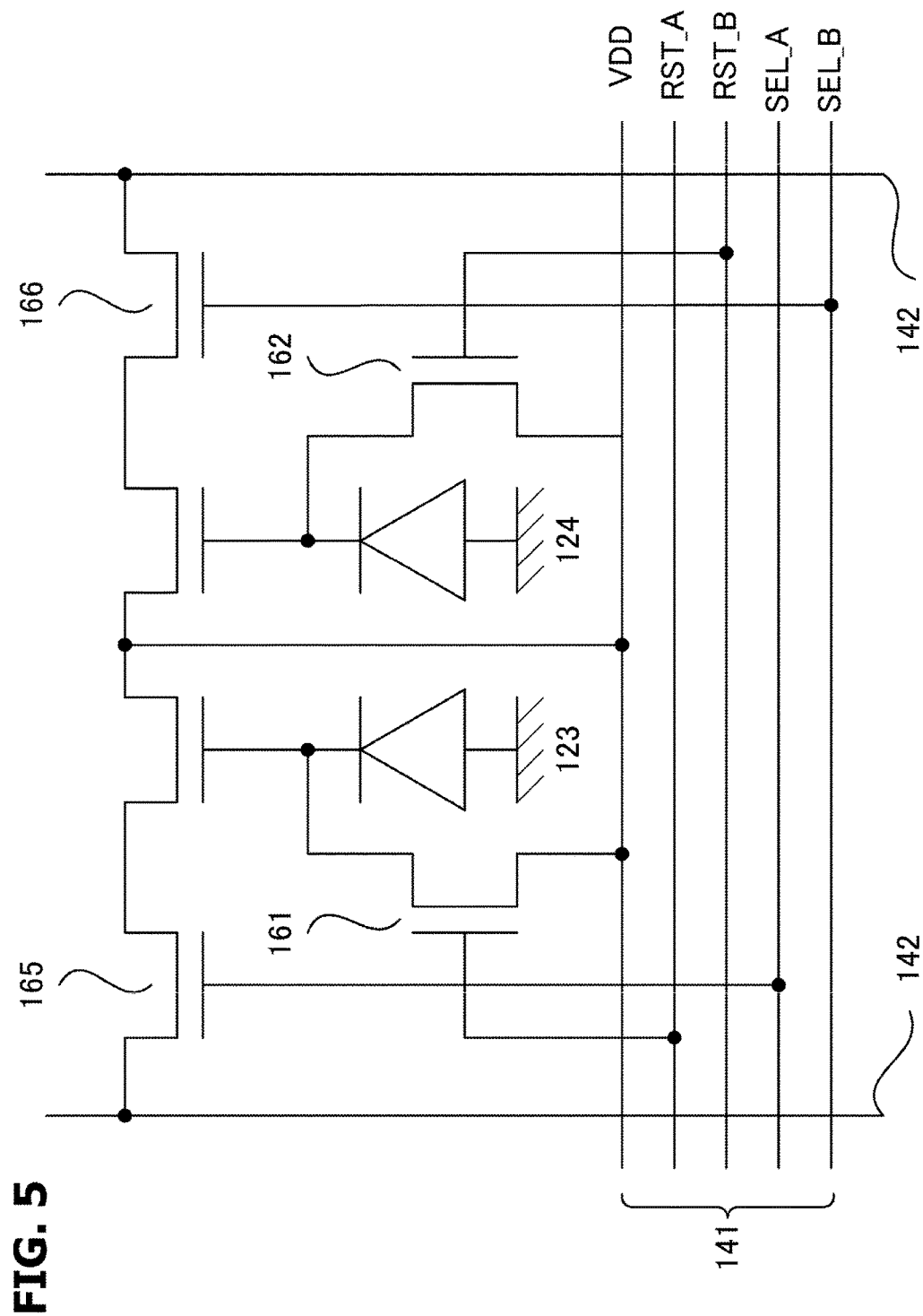
FIG. 5 illustrates a circuit diagram of a first ranging pixel according to Embodiment 1.
Figure 6:
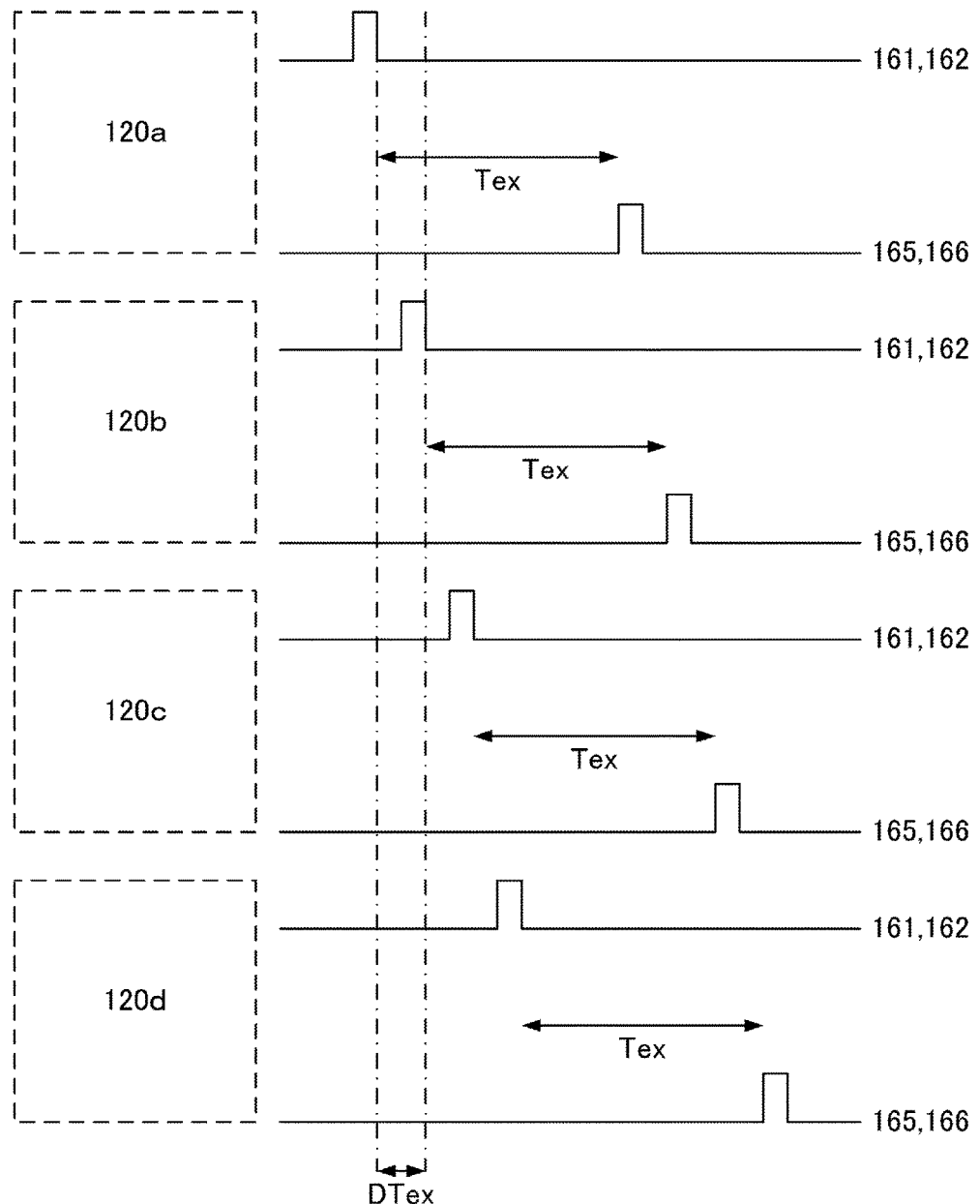
FIG. 6 illustrates an operation flow of first ranging pixels according to Embodiment 1.
Figure 7:
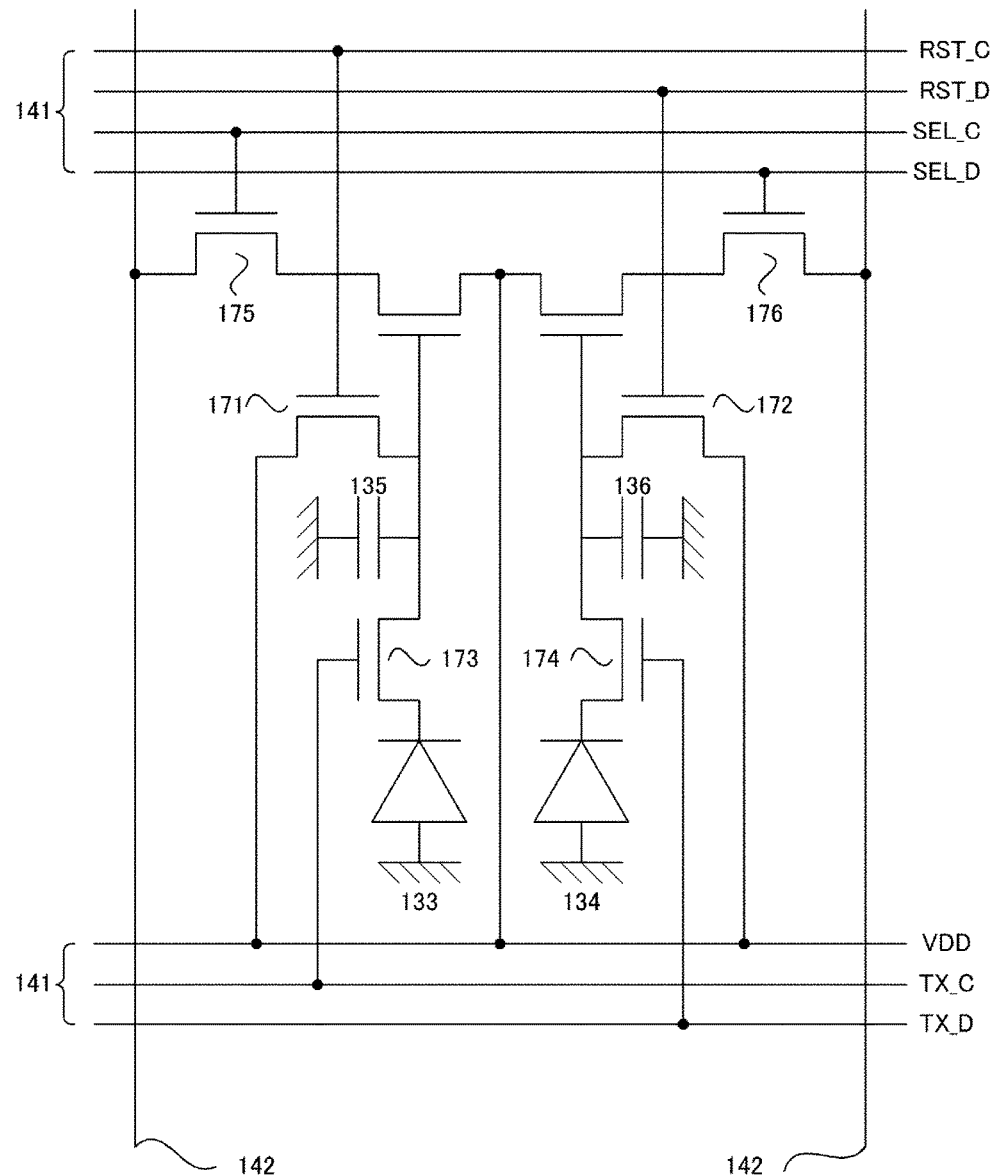
FIG. 7 illustrates a circuit diagram of a second ranging pixel according to Embodiment 1.
Figure 8:
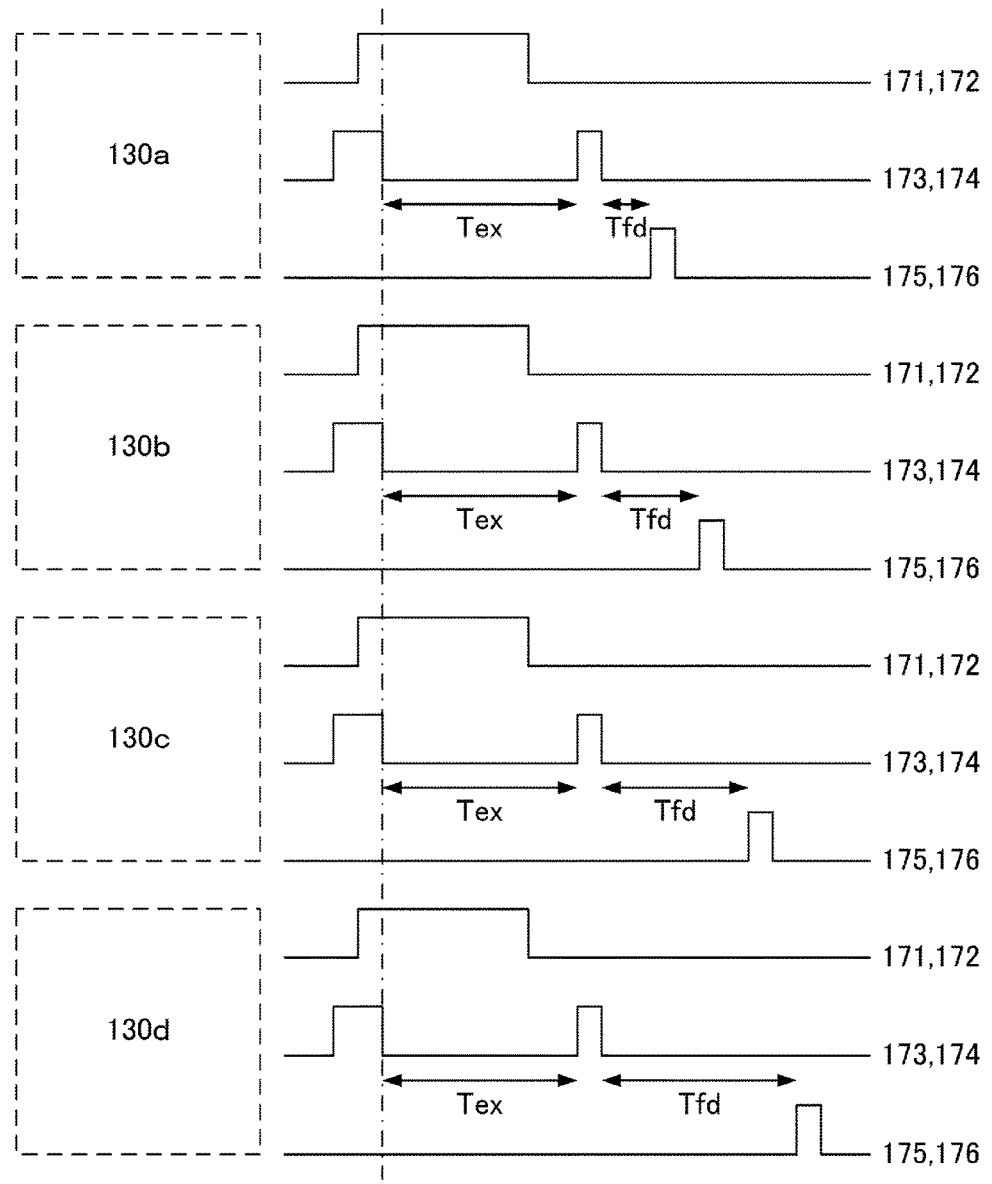
FIG. 8 illustrates an operation flow of second ranging pixels according to Embodiment 1.

An explanation follows next on the operation of detecting a pixel signal in the ranging pixels 120, 130. FIG. 5 is a circuit diagram of a ranging pixel 120, and FIG. 6 is a diagram for explaining the operation flow of a plurality of ranging pixels 120 that are lined up in a same column. Similarly, FIG. 7 is a circuit diagram of a ranging pixel 130, and FIG. 8 is a diagram for explaining the operation flow of a plurality of ranging pixels 130 that are lined up in a same column.

The signal detection operation of the ranging pixels 120 will be explained with reference to FIG. 5 and FIG. 6. Firstly, reset transistors (RSTs) 161, 162 are turned on by the horizontal driving lines 141, sequentially from the top row of the solid-state image sensor 110, to reset the photoelectric conversion units 123, 124 to a power source voltage (VDD). Next, the RSTs 161, 162 are similarly turned off, sequentially from the top row of the solid-state image sensor 110, to start charge accumulation in the photoelectric conversion units 123, 124. The charge accumulated in the photoelectric conversion units 123, 124 is outputted, in the form of a voltage signal, by a source follower from an amplification transistor that is connected to the photoelectric conversion units 123, 124. Lastly, select transistors (SELs) 165, 166 are turned on by the horizontal driving lines 141, sequentially from the top row of the solid-state image sensor 110, whereupon a pixel signal is transferred to the peripheral circuit by the vertical signal lines 142. In the ranging pixels 120, thus, a lapse of time Tex since the RSTs are turned off until the SELs are turned on constitutes the exposure time. As FIG. 6 illustrates, the exposure timing in the ranging pixels 120 (first ranging pixels) is offset by DTex for each row, and signals are detected with rolling shutter.

The signal detection operation of the ranging pixels 130 will be explained with reference to FIG. 7 and FIG. 8. Firstly, reset transistors (RSTs) 171, 172 and transfer transistors (TXs) 173, 174 of each of the ranging pixels 130 are turned on by the horizontal driving lines 141. As a result, all the photoelectric conversion units 133, 134 and in-pixel memories 135, 136 are reset to the power source voltage (VDD). Next, the TXs 173, 174 in all rows are turned off simultaneously, to start charge accumulation in the photoelectric conversion units 133, 134. After the RSTs 171, 172 have been turned off, the TXs 173, 174 in all rows are turned on simultaneously, to transfer the respective charge in the photoelectric conversion units 133, 134 to the in-pixel memories 135, 136. After transfer, the TXs 173, 174 are turned off, to thereby separate the photoelectric conversion units and in-pixel memories, and hold charge in the in-pixel memories 135, 136. The charge held in the in-pixel memories 135, 136 is outputted, as a voltage signal, by a source follower from an amplification transistor connected to the in-pixel memories. Lastly, select transistors (SELs) 175, 176 are turned on by the horizontal driving lines 141, sequentially from the top row of the solid-state image sensor 110, whereupon the pixel signals are transferred to the peripheral circuit by the vertical signal lines 142. In the ranging pixels 130, thus, a lapse of time Tex since the TXs are turned off until the TXs are turned on constitutes the exposure time. Signals can be sequentially read, for each row, while making the exposure timing simultaneous, by modifying a charge retention time Tfd in the in-pixel memory for each row, as illustrated in FIG. 8. That is, signal detection in the ranging pixels 130 (second ranging pixels) is performed with global shutter.

<Enhancement of Ranging Precision for a Dark Subject on the Basis of Differences in Aperture Ratio>

As illustrated in FIG. 3, the aperture ratio of the photoelectric conversion units 123, 124 of the ranging pixels 120 is greater than the aperture ratio of the photoelectric conversion units 133, 134 of the ranging pixels 130, by the extent that the in-pixel memories 135, 136 are absent in the photoelectric conversion units 123, 124. Therefore, it becomes possible to prevent drops in ranging precision for a dark subject by performing ranging of a dark subject using the ranging pixels 120. Specifically, when the magnitude of the acquired pixel signal is equal to or greater than a threshold value, the ranging pixels 120 or ranging pixels 130 (second ranging pixels) are used according to the direction of brightness value change of the subject, and when the magnitude is smaller than the threshold value, it suffices to perform ranging using the ranging pixels 120 (first ranging pixels).

To acquire image information along with ranging information in the ranging pixels, it suffices to convert the amount of charge of the plurality of photoelectric conversion units to voltage signals, followed by addition in the peripheral circuit. The addition voltage signal results from acquisition of a light beam that passes through the entire pupil region of the imaging optical system 101; as a result, it becomes possible to acquire image information in the ranging pixels. Sensitivity differences between the ranging pixels 120 and the ranging pixels 130, derived from differences in the aperture ratio of the photoelectric conversion units, may be corrected through gain adjustment.

<Expansion of Dynamic Range by Exploiting Differences in Aperture Ratio>

Figure 9:
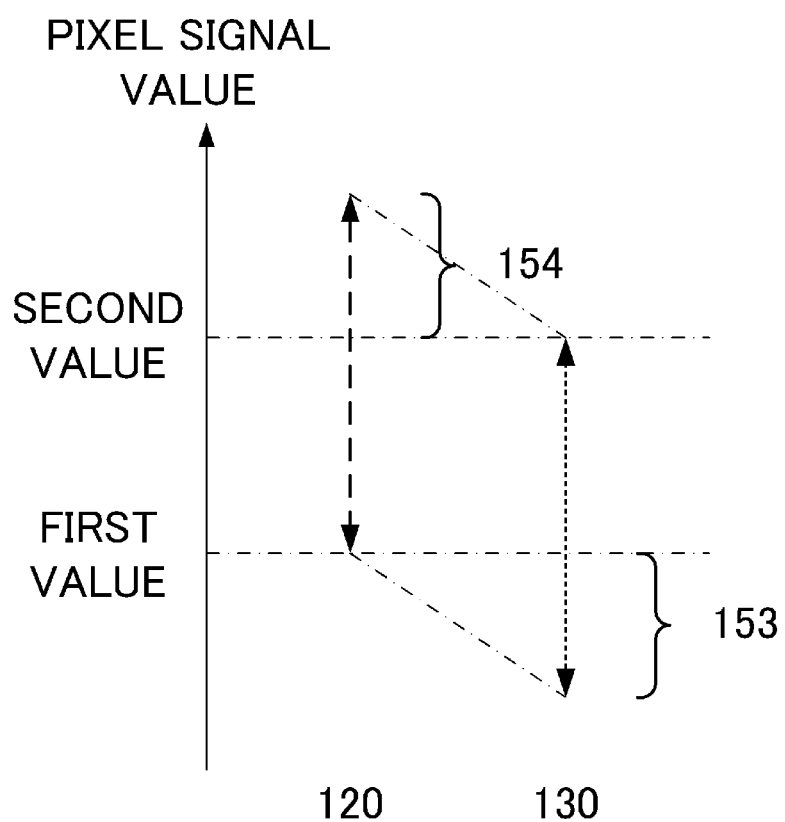
FIG. 9 illustrates signal values acquired in first ranging pixels and second ranging pixels.

The dynamic range of the captured image can be expanded exploiting the feature whereby the aperture ratio of the photoelectric conversion units 123, 124 in the ranging pixels 120 is larger than the aperture ratio of the photoelectric conversion units 133, 134 in the ranging pixels 130. Upon imaging under identical exposure conditions, the pixel signal value (dashed line) acquired in the ranging pixels 120 is larger than the pixel signal value (dotted line) acquired in the ranging pixels 130, as illustrated in FIG. 9. As a result, the image acquired in the ranging pixels 120, though prone to exhibit blown out highlights at bright portions of the subject, boasts high image quality at dark portions. On the other hand, the image acquired in the ranging pixels 130, though prone to exhibit crushed blacks at dark portions of the subject, boasts high image quality at bright portions.

A high-quality image can therefore be acquired according to the following scheme. In a portion 153 where the pixel signal of the ranging pixels 130 (second ranging pixels) is smaller than a first value, there is used a pixel signal acquired in the ranging pixels 120 (first ranging pixels). On the other hand, in a portion 154 where the pixel signal of the ranging pixels 120 (first ranging pixels) is larger than a second value, there is used a pixel signal acquired in the ranging pixels 130 (second ranging pixels). An image having few blown out highlights or crushed blacks can then be acquired by lastly combining both images. Herein, the first value is a minimum value of pixel signal acquirable by the ranging pixels 120, and the second value is a maximum value of pixel signal acquirable by the ranging pixels 130. Either value may be used for portions free of blown out highlights and crushed blacks (portions at which the pixel signal of the ranging pixels 130 is equal to or greater than the first value, and a pixel signal of the ranging pixels 120 is equal to or smaller than the second value), whether acquired in the ranging pixels 120 or the ranging pixels 130. More preferably, the gain in the ranging pixels 120 and the ranging pixels 130 at the time of composite image generation is adjusted by comparing the two values, since by doing so, it becomes possible to acquire an image that involves little discomfort during compositing.

<Motion Detection by Exploiting Image Distortion>

Subject motion information can be acquired by comparing a subject image acquired in the ranging pixels 120 and a subject image acquired in the ranging pixels 130. When rolling shutter is utilized, there is an offset in the exposure timings between different rows, as described above, and a distorted subject image is acquired as a result. On the other hand, the exposure timings of all pixels are simultaneous when global shutter is utilized, and accordingly a distortion-free subject image is acquired that reflects the shape of the subject. In a case where the solid-state image sensor illustrated in the present invention is used, specifically, a distorted subject image can be acquired in the ranging pixels 120 that utilize rolling shutter, and a distortion-free subject image can be acquired in the ranging pixels 130 that utilize global shutter. Subject motion information can be acquired as a result by comparing the degrees of distortion between both images.

This can be accomplished specifically as follows. Firstly, the difference in degree of distortion, between the row direction and the column direction, in the subject image acquired in the ranging pixels 120 and the subject image acquired in the ranging pixels 130 is compared. Next, the distortion amount on the image plane is converted to the actual distortion amount of the subject, using the distance information acquired in the ranging pixels. Lastly, it suffices to perform conversion to subject motion information (speed), using an offset time (time) of exposure timing with rolling shutter and the actual distortion amount (length) of the subject. The distortion amount in the row direction corresponds to motion in the X direction, and the distortion amount in the column direction corresponds to motion in the Y direction. In the solid-state image sensor illustrated in the present invention, thus, motion information on a subject that is moving at high speed can be acquired by mixing pixels that utilize rolling shutter and pixels that utilize global shutter.

<Variation 1: Increase in Aperture Ratio Through Arrangement of Memories at Pixel Boundaries>

Figure 10:
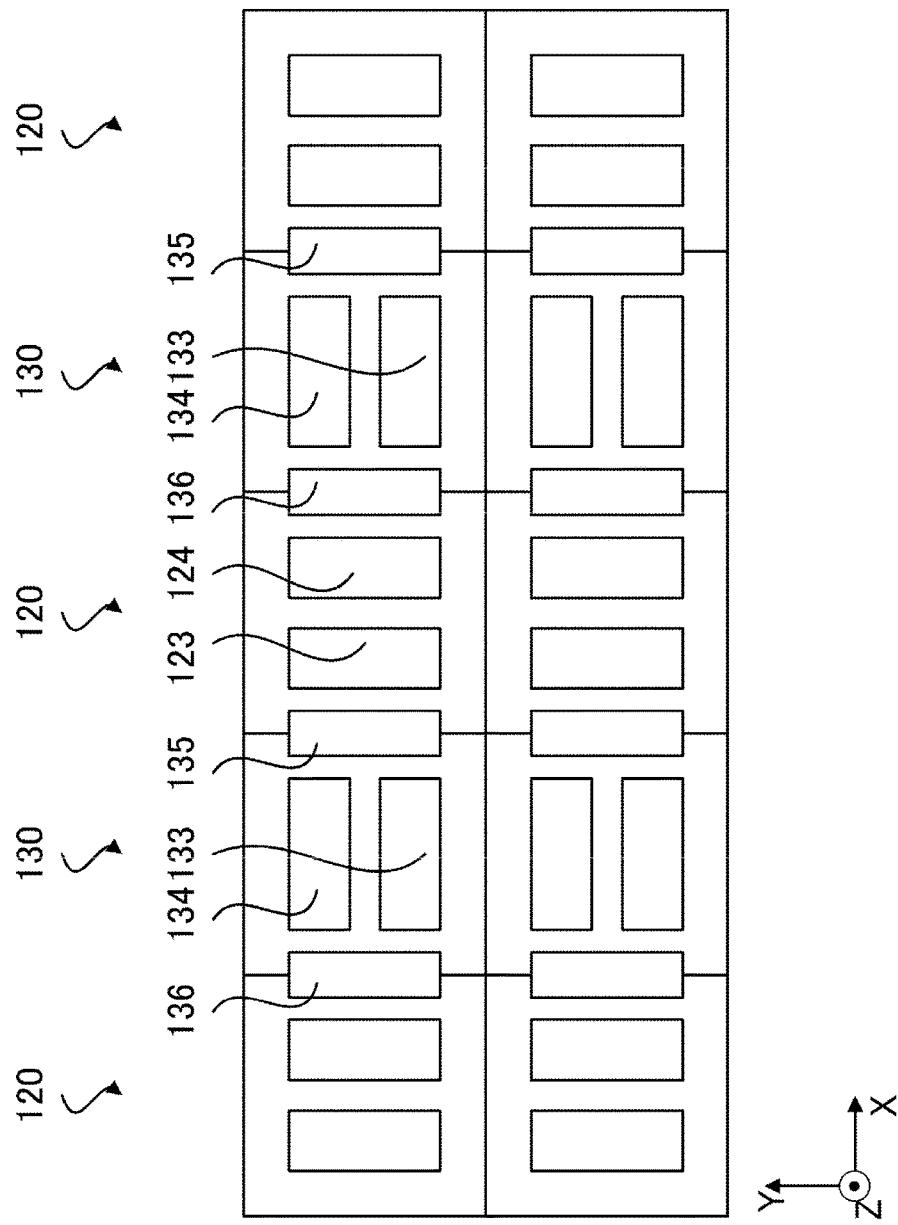
FIG. 10 illustrates a variation of the arrangement of in-pixel memories.

More preferably, the in-pixel memories 135, 136 are disposed, in adjacent ranging pixels 120 and ranging pixels 130, in such a way so as to straddle the boundaries between the ranging pixels 130 and the ranging pixels 120; drops in the aperture ratio of the photoelectric conversion unit 133 and 134 in the ranging pixels 130 can be prevented by doing so (FIG. 10). Drops in the ranging precision for a dark subject can be prevented, for both ranging pixels 120, 130, when such a solid-state image sensor 110 is used. Specifically, it becomes possible to combine enhanced ranging precision for a subject that is moving at high speed, with enhanced ranging precision for a dark subject, regardless of the direction of brightness value change of the subject. In a more preferred instance, image information is acquired together with ranging information, since in this case it is not necessary to correct a sensitivity difference between the ranging pixels 120 and the ranging pixels 130.

<Variation 2: Enhanced Aperture Ratio by Using One Memory in the Ranging Pixels 130>

Figure 11:
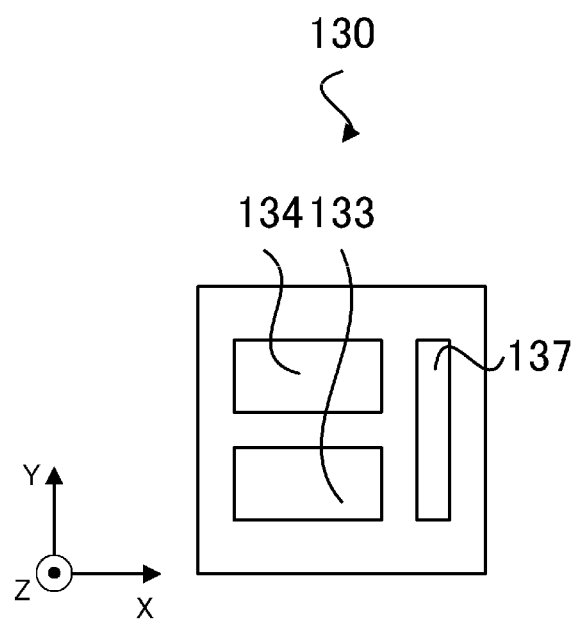
FIG. 11 illustrates a variation of a second ranging pixel.

FIG. 3 illustrates an example where respective in-pixel memories 135, 136 are provided in the photoelectric conversion units 133, 134, but, alternatively, a common in-pixel memory 137 may be provided for the photoelectric conversion units 133, 134 (FIG. 11). The ranging pixel 130 illustrated in FIG. 11 has fewer in-pixel memories than the ranging pixel 130 illustrated in FIG. 3. The aperture ratio of the photoelectric conversion units can be accordingly enhanced. This is preferable as a result since ranging precision for a dark subject can be enhanced upon ranging using the ranging pixels 130.

Figure 12:
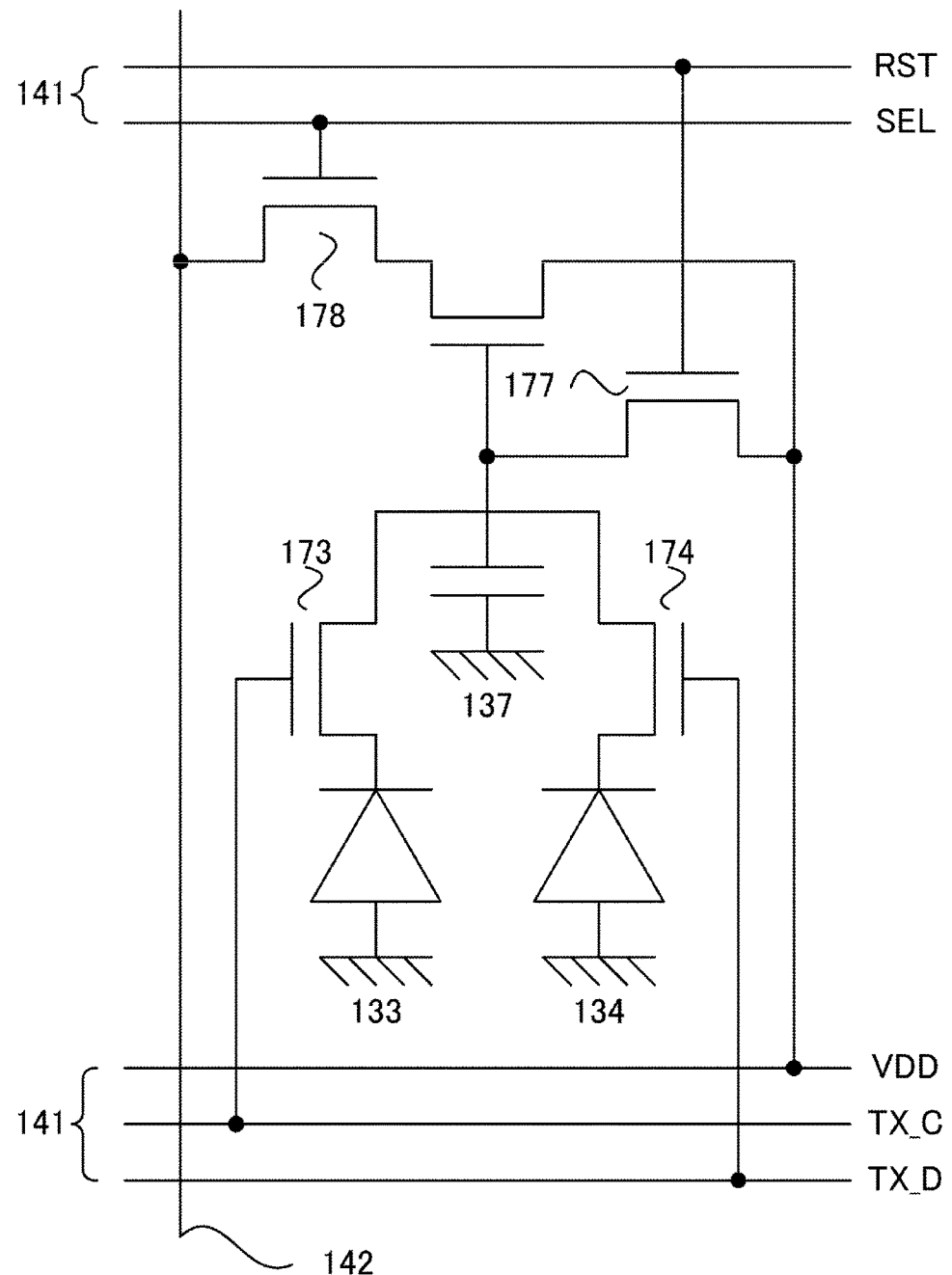
FIG. 12 illustrates a circuit diagram of a second ranging pixel.
Figure 13:
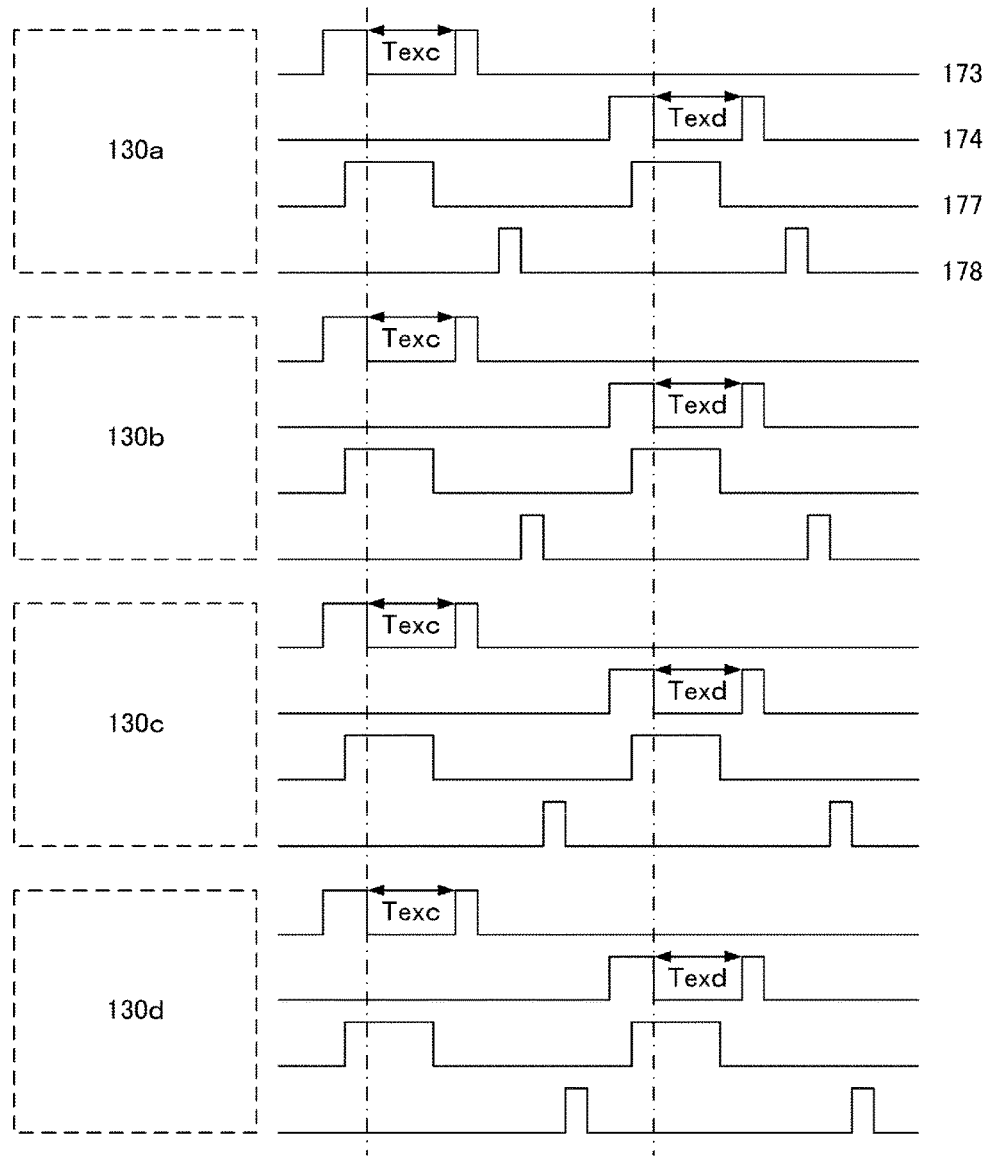
FIG. 13 illustrates an operation flow of second ranging pixels.

The pixel signal detection operation of the ranging pixels 130 provided with the common in-pixel memory 137 will be explained next with reference to the circuit diagram of FIG. 12 and the operation flow of FIG. 13. Firstly, reset transistors (RSTs) 177 and transfer transistors (TXs) 173 are turned on, to reset both the photoelectric conversion units 133 and the in-pixel memories 137. Next, the TXs 173 in all rows are turned off simultaneously, to start charge accumulation in the photoelectric conversion units 133. After turn-off of the RSTs 177, the TXs 173 in all rows are turned on simultaneously, to transfer the charge in the photoelectric conversion units 133 to the in-pixel memories 137. After transfer, the TXs 173 are turned off, whereby charge transferred from the photoelectric conversion units 133 is held in the common in-pixel memories 137. Lastly, select transistors (SELs) 178 are turned on, sequentially from the top row of the solid-state image sensor 110, to transfer pixel signals to the peripheral circuit. In the photoelectric conversion unit 133, specifically, a lapse of time Texc since the TXs 173 are turned off until the TXs 173 are turned on constitutes the exposure time. In the operation thus far, the signals acquired in the photoelectric conversion units 133 can be read with global shutter.

Next, reset transistors (RSTs) 177 and transfer transistors (TXs) 174 are turned on, to reset both the photoelectric conversion unit 134 and the in-pixel memory 137. Next, the TXs 174 in all rows are turned off simultaneously, to start charge accumulation in the photoelectric conversion units 134. After turn-off of the RST 177, the TXs 174 in all rows are turned on simultaneously, to transfer the charge in the photoelectric conversion units 134 to the in-pixel memories 137. After transfer, the TXs 174 are turned off, whereby charge transferred from the photoelectric conversion units 134 is held in the common in-pixel memories 137. Lastly, select transistors (SELs) 178 are turned on, sequentially from the top row of the solid-state image sensor 110, to transfer pixel signals to the peripheral circuit. In the photoelectric conversion units 134, specifically, a lapse of time Texd since the TXs 174 are turned off until the TXs 174 are turned on constitutes the exposure time. In the operation thus far, the signals acquired in the photoelectric conversion units 134 can be read with global shutter.

Figure 14:
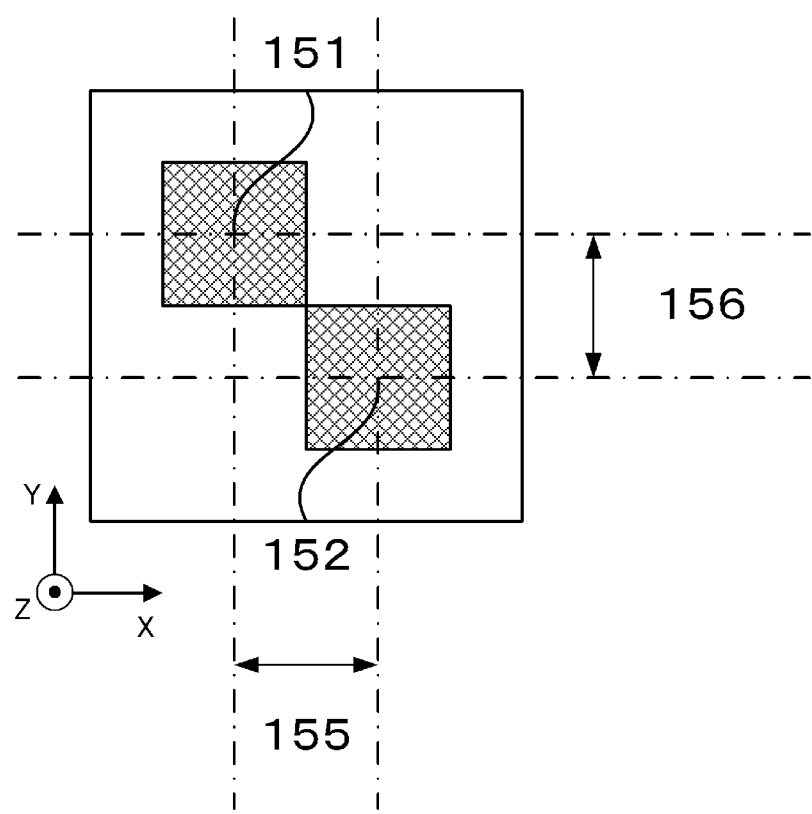
FIG. 14 illustrates an image acquired in a variation of a second ranging pixel.

In the ranging pixels 130 (second ranging pixels) illustrated in FIG. 11, thus, there is an offset in the exposure timings between signals acquired in the photoelectric conversion units 133 and the signals acquired in the photoelectric conversion units 134. However, exposure timings between photoelectric conversion units 133 in each row are simultaneous, and accordingly each C image 151 acquired in the photoelectric conversion units 133 is an image that reflects the subject at respective identical points in time (FIG. 14). Similarly, exposure timings between photoelectric conversion units 134 in each row are simultaneous, and accordingly each D image 152 acquired in the photoelectric conversion units 134 is an image that reflects the subject at respective identical points in time. Therefore, high-precision ranging also for a subject that is moving at high speed can be performed by comparing the brightness value change of each C image 151 along the column direction, and the brightness value change of each D image 152 along the column direction.

When the subject is moving in the X direction, a shift 155 arises, between the C image 151 and the D image 152, in the X direction (row direction) in which the motion of the subject is reflected, as can be seen in FIG. 14. Preferably, therefore, the image shift (image displacement) 156 is detected after correction of the shift 155, in the row direction, that arises between the C image and the D image. A method for correcting the shift 155 in the row direction may involve, for instance, extracting a feature point of the image, and shifting the C image or the D image in the row direction, in such a manner that the feature point overlaps between the C image and the D image. The image shift 156 between the C image and the D image that arises due to pupil division occurs in the column direction, and accordingly ranging can be performed without loss of parallax information, in the column direction, between the C image and the D image, even when the image is shifted in the row direction.

<Arrangement of the Ranging Pixels 120 and the Ranging Pixels 130>

In FIG. 2, columns of the ranging pixels 120 that perform pupil division in the row direction and the columns of the ranging pixels 130 that perform pupil division in the column direction are disposed alternately, in equal numbers. However, any from among the ranging pixels may be disposed in a larger number thereof, or may be disposed not alternately. Imaging pixels for acquiring light from the entire pupil region may be provided besides the ranging pixels. In a case where the ranging pixels are only some of the pixels, the image information may be acquired in the ranging pixels on the basis of a sum of signals from the photoelectric conversion units of the ranging pixels, or alternatively, image information in the ranging pixels may be acquired through interpolation on the basis of images acquired at surrounding imaging pixels. The signals from the imaging pixels may be read with rolling shutter, or may be read with global shutter.

<Number of Photoelectric Conversion Units in the Ranging Pixels>

FIG. 3 illustrates an example in which there are two photoelectric conversion units in the ranging pixels, but the number of photoelectric conversion units in the ranging pixels may be three or greater. A finer pupil division can be performed by increasing the number of photoelectric conversion units.

<Variation of Ranging Pixels>

A plurality of pixels that detects a light beam that passes through part of the pupil of the imaging optical system 101 may be used as ranging pixels, as illustrated in FIG. 15. Imaging pixels 111 and ranging pixels 180, 181, 190, 191 illustrated in FIG. 15 each have a micro-lens 112 and a single photoelectric conversion unit 114 that is disposed within a substrate 113. The ranging pixels 180, 181, 190, 191 each have a light-shielding film 115, between the micro-lens 112 and a substrate 113, such that the light-shielding film 115 is shifted with respect to the optical axis of the micro-lens 112.

By adopting the above configuration, the ranging pixels 180 receive selectively a light beam from the pupil region, in the +X direction, of the imaging optical system 101, and the ranging pixels 181 receive selectively a light beam from the pupil region in the −X direction, of the imaging optical system 101. In the image acquired in the ranging pixels 180 and the image acquired in the ranging pixels 181, image shift occurs in the X direction (row direction), and accordingly ranging can be performed by comparing both acquired images. Similarly, the ranging pixels 190, 191 are configured so as to selectively receive a light beam from the pupil region, in the +Y direction and the −Y direction, respectively, of the imaging optical system. Image shift in the Y direction (column direction) arises between the image acquired in the ranging pixels 190 and the image acquired in the ranging pixels 191, and accordingly ranging can be performed by comparing both acquired images.

In order to perform pupil division in the row direction, there may be used the imaging pixels 111 that acquire light from the entire pupil region, instead of the ranging pixels 180 (181). Signals by light beams from the pupil region in the −X direction (+X direction) can be acquired on the basis of differences between signals acquired in the imaging pixels 111 that receive light from the entire pupil region, and signals acquired by the ranging pixels 180 (181). Similarly, pupil division in the column direction may be performed by working out a signal difference using the imaging pixels 111, instead of the ranging pixels 190 (191).

FIG. 16 is a diagram illustrating the arrangement of ranging pixels in the solid-state image sensor having ranging pixels such as those illustrated in FIG. 15. In the solid-state image sensor illustrated in FIG. 16(a), the ranging pixels 120 are replaced by ranging pixels 180 and 181, and the ranging pixels 130 by ranging pixels 190 and 191, with respect to the arrangement of the solid-state image sensor 110 illustrated in FIG. 2. The solid-state image sensor illustrated in FIG. 16(b) has a configuration wherein ranging pixels 120 are replaced by ranging pixels 180 and imaging pixels 111 and the ranging pixels 130 are replaced by ranging pixels 190 and imaging pixels 111, such that ranging is performed by working out a signal difference.

In the case of the solid-state image sensor illustrated in FIG. 16(a), it suffices to read, with rolling shutter, the signals of the ranging pixels 180 and 181 that perform pupil division in the row direction, and to read, with global shutter, the signals of the ranging pixels 190 and 191. In a case where pupil division is performed on the basis of a signal difference using the imaging pixels 111, as in the solid-state image sensor illustrated in FIG. 16(b), the signal reading scheme of the imaging pixels 111 may be as follows. Rolling shutter is utilized in the imaging pixels 111 in a case where the ranging pixels 180 and 181 are used as a counterpart for working out the difference with respect to these imaging pixels 111. On the other hand, global shutter is utilized in the imaging pixels 111 in a case where the ranging pixels 190 and 191 are used as a counterpart for working out the difference with respect to these imaging pixels 111. By adopting the above configuration, it becomes possible to enhance ranging precision for a subject that is moving at high speed, without utilizing global shutter for all pixels.

Embodiment 2

A solid-state image sensor 210 described in Embodiment 2 differs from the solid-state image sensor 110 described in Embodiment 1 only with regard to the configuration and the operation flow of the first ranging pixels (ranging pixels 220 in Embodiment 2) that perform pupil division in the X direction.

Figure 17:
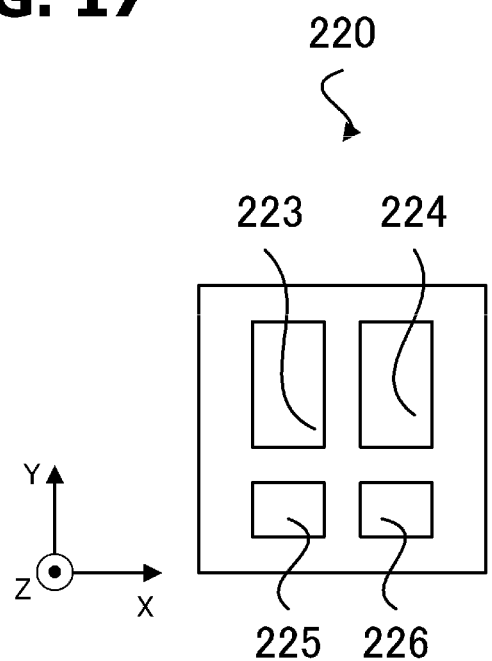
FIG. 17 illustrates a first ranging pixel in a solid-state image sensor according to Embodiment 2.

FIG. 17 is a diagram illustrating the pixel internal configuration of a ranging pixel 220 in the solid-state image sensor 210. Each ranging pixel 220 is provided with in-pixel memories 225, 226 corresponding to the photoelectric conversion units 223, 224. The ranging pixels 220 differ from the ranging pixels 120 of Embodiment 1 in that now correlated double sampling (CDS) is performed using the in-pixel memories 225, 226. Herein, CDS involves removing a dark level signal in a circuit by reading beforehand a dark level signal of the in-pixel memory before charge transfer, and taking the difference with respect to the signal after charge transfer.

By adopting the above configuration, it becomes possible to reduce the dark level in a circuit, and to enhance the precision of ranging in which the ranging pixels 220 are used. In particular, the effect of enhancing the ranging precision for a dark subject is pronounced, since the darker a subject is, the more likely a drop in ranging precision becomes due to noise.

Figure 18:
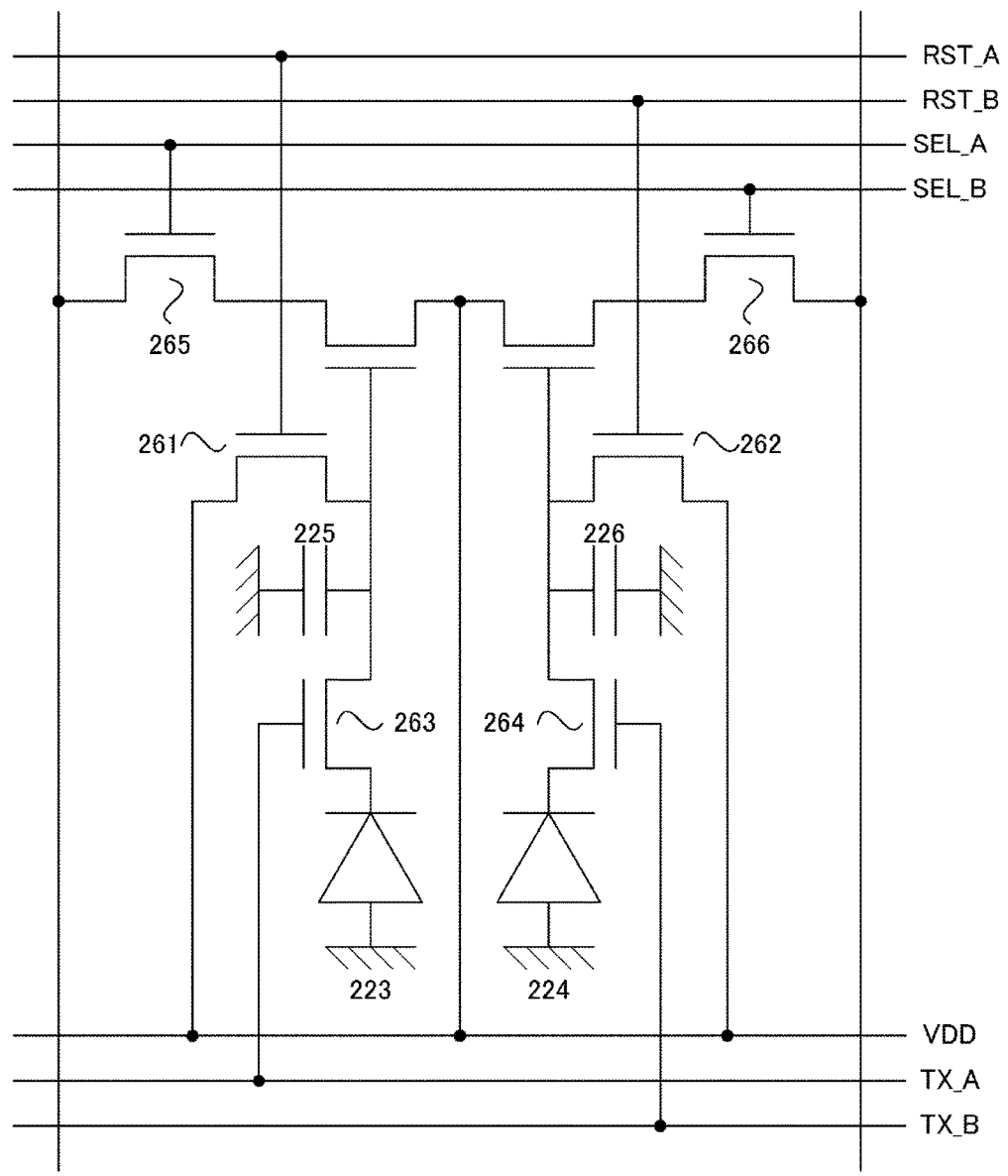
FIG. 18 illustrates a circuit diagram of a first ranging pixel according to Embodiment 2.
Figure 19:
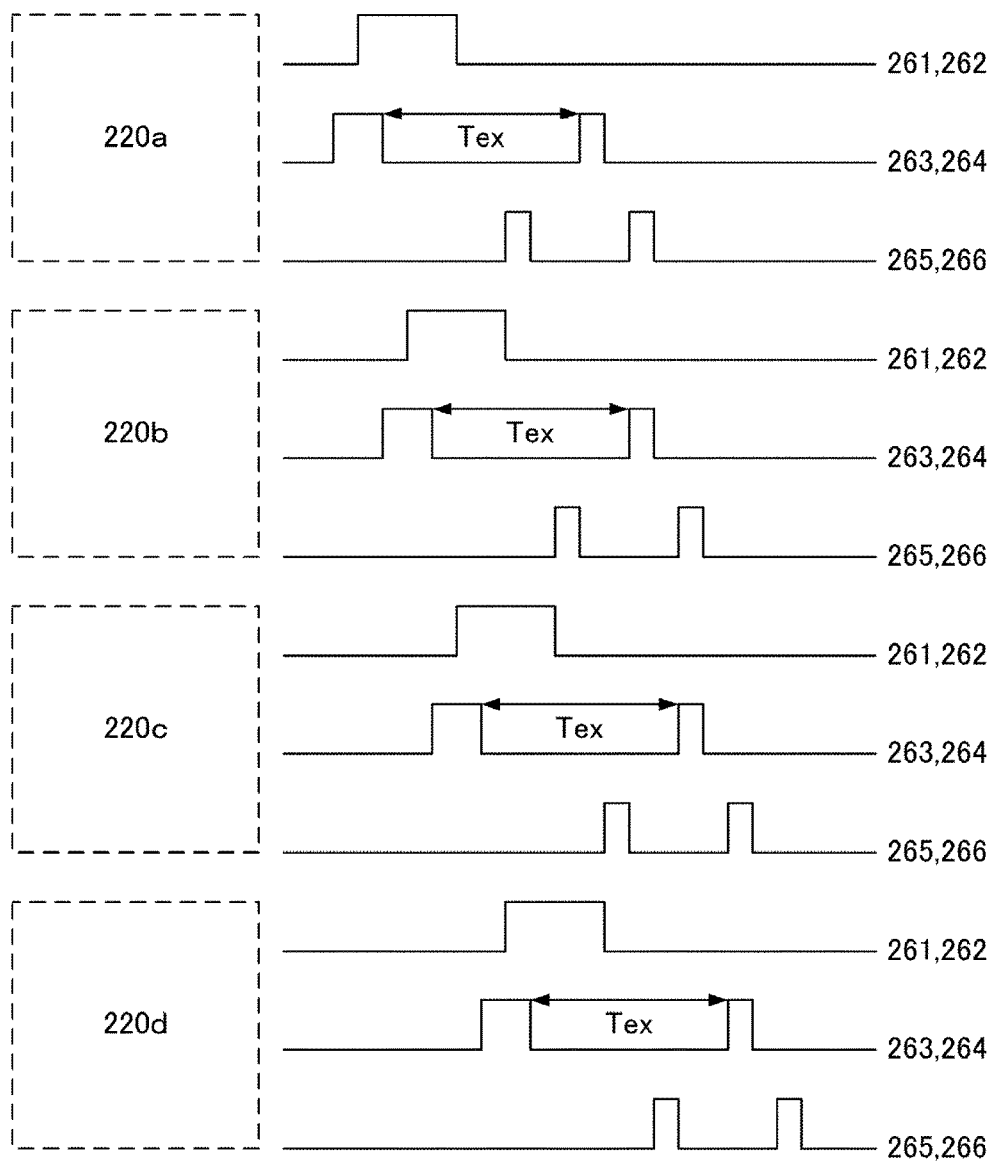
FIG. 19 illustrates an operation flow of first ranging pixels according to Embodiment 2.

The operation flow of the ranging pixels 220 will be explained with reference to the circuit diagram of FIG. 18 and the operation flow of FIG. 19. Firstly, reset transistors (RSTs) 261, 262 and transfer transistors (TXs) 263, 264 are turned on, to reset all the photoelectric conversion units 223, 224 and in-pixel memories 225, 226. Next, the TXs 263, 264 are turned off, sequentially from the top row of the solid-state image sensor 210, to start charge accumulation in the photoelectric conversion units 223, 224.

The dark level signal for performing CDS is read beforehand while charge is being accumulated. Specifically, the RSTs 261, 262 are turned from on to off, and thereafter, select transistors (SELs) 265, 266 are turned on, sequentially from the top row solid-state image sensor 210, to transfer thereby the dark level signal in the in-pixel memories 225, 226 to the peripheral circuit.

Next, the TXs 263, 264 are turned on, sequentially from the top row of the solid-state image sensor 210, to transfer thereby the charge in the photoelectric conversion units 223, 224 to the in-pixel memories 225, 226, respectively. The TXs 263, 264 are then turned off, to separate the photoelectric conversion units from the in-pixel memories, and thereafter, the select transistors (SELs) 265, 266 are turned on, sequentially from the top row of the solid-state image sensor 210, to transfer thereby a voltage signal to the peripheral circuit. The voltage signal read at this time is the sum of a pixel signal from charge transferred from the photoelectric conversion units to the in-pixel memories, and the dark level signal.

It is then possible to detect the pixel signal alone by lastly taking the difference between the sum of the pixel signal plus the dark level, and the dark level signal read beforehand. As FIG. 19 illustrates, the exposure time Tex in the respective ranging pixels 220 is offset at each row, i.e. signals are detected with rolling shutter.

In the solid-state image sensor 210 of Embodiment 2, thus, both the ranging pixels 220 that perform pupil division in the X direction, and the ranging pixels 130 that perform pupil division in the Y direction have in-pixel memories, but the functions of these in-pixel memories are different. When rolling shutter is utilized, the in-pixel memories are used for global shutter, in the ranging pixels 130, which have the problem of drop in ranging precision for a subject that is moving at high speed. When rolling shutter is utilized, by contrast, the in-pixel memories are used in CDS in the ranging pixels 220, where the drop in ranging precision for a subject that is moving at high speed is small. Adopting such a configuration allows enhancing, in particular, the ranging precision for a dark subject, as compared with an instance where global shutter applies to all ranging pixels, while enhancing the ranging precision for an object moving at high speed.

In a case where image information is acquired from signals that are acquired in the ranging pixels 220, it becomes not only possible to increase ranging precision, but, at the same time, also the image quality of captured images, thanks to the noise reducing effect elicited by CDS.

<Variations>

Figure 20:
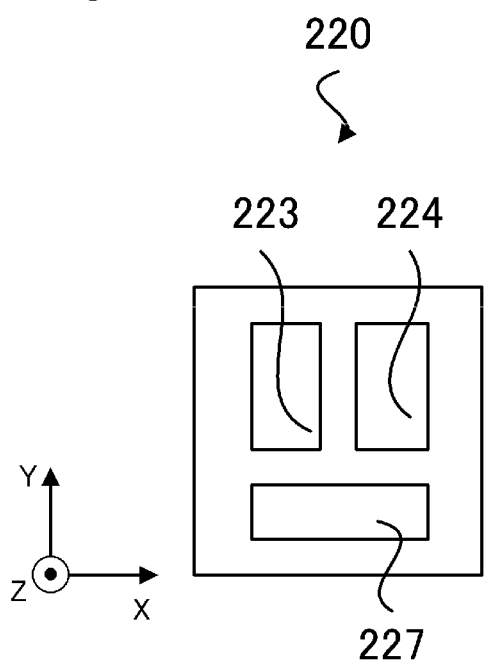
FIG. 20 illustrates a variation of a first ranging pixel.

As illustrated in FIG. 20, CDS may be performed by providing a common in-pixel memory 227 for the photoelectric conversion units 223, 224. In this case, CDS may be performed as follows. Firstly, a dark level is read from a signal of a time where the in-pixel memory 227 is empty. Next, charge from either the photoelectric conversion unit 223 or 224 (third photoelectric conversion unit) is transferred to the in-pixel memory 227, and a reading of the sum of a voltage signal from charge accumulated in either the photoelectric conversion unit 223 or 224 (third photoelectric conversion unit), plus the dark level is performed. Lastly, the charge accumulated in another photoelectric conversion unit (fourth photoelectric conversion unit) is transferred to the in-pixel memory 227, and a reading of the sum of a voltage signal from the total charge acquired in the photoelectric conversion units 223, 224, plus the dark level is performed.

By taking these differences it becomes thus possible to detect a pixel signal alone. An instance is also conceivable wherein a first signal is read through transfer of charge of the photoelectric conversion unit 223, initially, followed by reading of a second signal through transfer of charge of the photoelectric conversion unit 224. In this case, the pixel signal acquired in the photoelectric conversion unit 224 can be detected on the basis of the difference between the second signal and the first signal. Further, the pixel signal acquired in the photoelectric conversion unit 223 can be detected on the basis of the difference between the first signal and the dark level. A further instance is also conceivable wherein the first signal is read through transfer of charge of the photoelectric conversion unit 224, initially, followed by reading of the second signal through transfer of charge of the photoelectric conversion unit 223. In this case, the pixel signal acquired in the photoelectric conversion unit 223 can be detected on the basis of the difference between the second signal and the first signal, and the pixel signal acquired in the photoelectric conversion unit 224 can be detected on the basis of the difference between the first signal and the dark level.

Further, global shutter and CDS may be combined by additionally providing an in-pixel memory for CDS in the ranging pixels 130, in addition to the in-pixel memories 135, 136. However, providing additionally a memory for CDS entails a smaller aperture ratio of the photoelectric conversion units, and limitations in the layout of transistors and wiring.

Embodiment 3

A solid-state image sensor 310 described in Embodiment 3 differs from the solid-state image sensor 210 described in Embodiment 2 only with regard to the operation flow of ranging pixels 330 (second ranging pixels) that perform pupil division in the Y direction.

The ranging pixels 330 differ from the ranging pixels 130 in that now CDS is performed, in addition to global shutter, using in-pixel memories 335, 336. In this case, CDS alone is performed in the photoelectric conversion unit of lower sensitivity from among the photoelectric conversion units 333, 334, while global shutter alone is performed in the photoelectric conversion unit of higher sensitivity, with no CDS being performed in the latter.

By virtue of the above configuration it becomes possible to combine dark level reduction and global shutter in the ranging pixels 330. As a result, the ranging precision for a dark subject can also be enhanced while enhancing the ranging precision for a subject that is moving at high speed.

Figure 21:
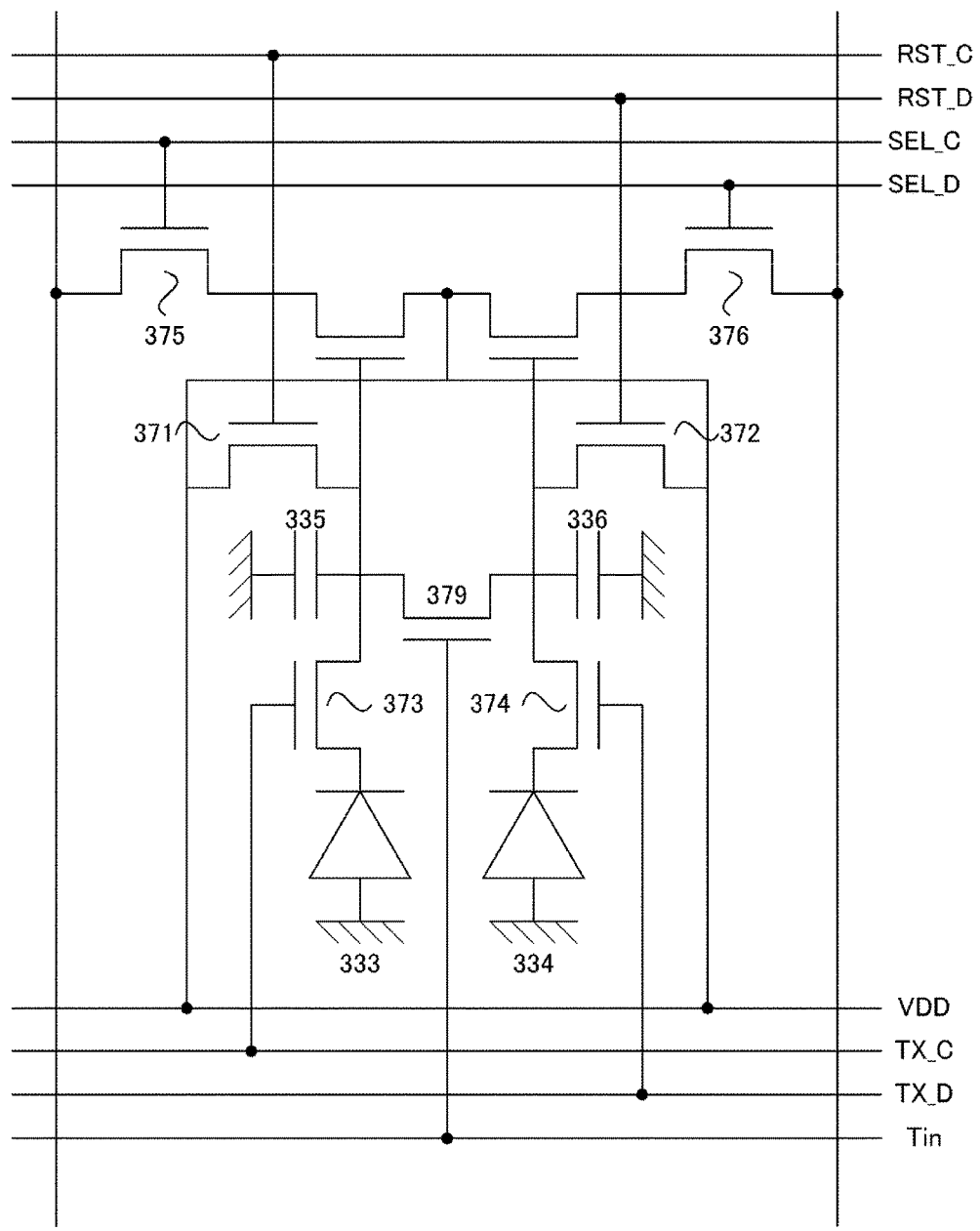
FIG. 21 illustrates a circuit diagram of a second ranging pixel according to Embodiment 3.
Figure 22:
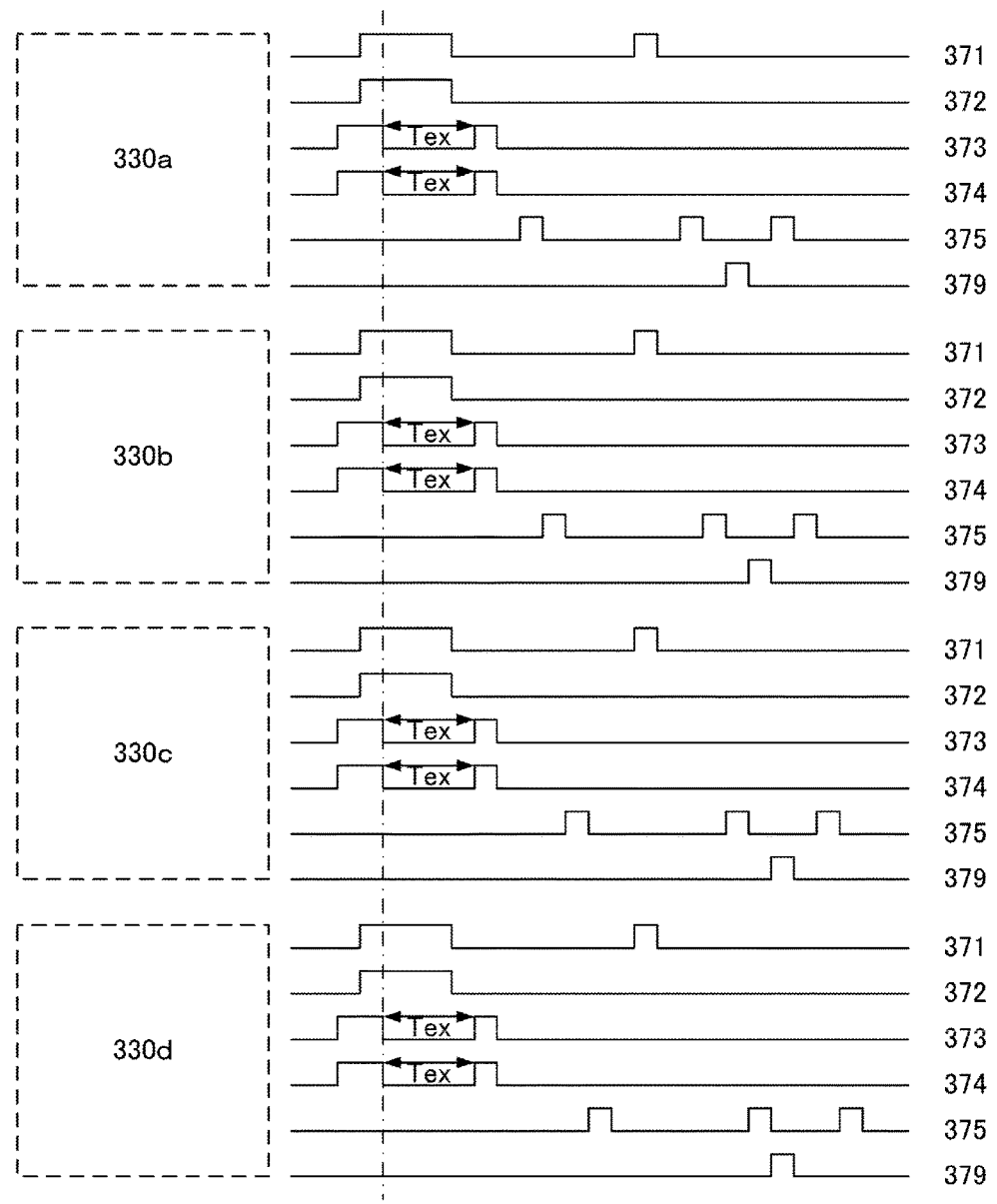
FIG. 22 illustrates an operation flow of second ranging pixels according to Embodiment 3.

The signal reading method of the ranging pixels 330 will be explained next with reference to FIG. 21 and FIG. 22. FIG. 21 is a circuit diagram of the ranging pixels 330, and FIG. 22 is an operation flow thereof. An instance will be explained next where the sensitivity of the photoelectric conversion unit 333 is higher than that of the photoelectric conversion unit 334. In a case where the sensitivity of the photoelectric conversion unit 334 is higher than that of the photoelectric conversion unit 333, it suffices to swap the operation timings of the transistors connected to the photoelectric conversion units 333, 334.

Firstly, reset transistors (RSTs) 371, 372 and transfer transistors (TXs) 373, 374 of the ranging pixels 330 are turned on, to reset all the photoelectric conversion units 333, 334 and in-pixel memories 335, 336. Next, the TXs 373, 374 of all rows are turned off simultaneously, to start charge accumulation in the photoelectric conversion units 333, 334. After the RSTs 371, 372 have been turned off, the TXs 373, 374 of all rows are turned on simultaneously, to transfer the respective charge in the photoelectric conversion units 333, 334 to the in-pixel memories 335, 336. After transfer, the TXs 373, 374 are turned off, thereby to separate the photoelectric conversion units and in-pixel memories, and hold charge in the in-pixel memories 335, 336. The operation thus far is identical to that in the operation flow of the ranging pixels 130 illustrated in FIG. 7 and FIG. 8.

Next, the voltage signal read by a source follower connected to the in-pixel memories 335 is transferred to the peripheral circuit, through turn-on of the select transistors (SELs) 375, sequentially from the top row of the solid-state image sensor 310. Specifically, the pixel signals acquired in the photoelectric conversion units 333 (first photoelectric conversion unit) of relatively higher sensitivity are held in the in-pixel memories 335 (first in-pixel memory) for global shutter, and are read thereafter, without CDS being performed.

The operation moves on next to an operation of reading, according to CDS, the charge that is transferred from the photoelectric conversion units 334 of relatively lower sensitivity and that is held in the in-pixel memories 336. Firstly, the RSTs 371 are turned on, to reset the in-pixel memories 335. After the RSTs 371 have been turned off, the dark level at a time where the in-pixel memories 335 are empty is read, and the SELs 375 are turned on, to transfer the dark level to the peripheral circuit. Thereafter, internal transfer transistors (Tin) 379 disposed between the in-pixel memories are turned on, to transfer charge from the in-pixel memories 336 to the in-pixel memories 335. The sum of the signal from charge transferred to the in-pixel memories 335, plus the dark level, is transferred to the peripheral circuit through turning-on of the SELs 375, sequentially from the top row of the solid-state image sensor 310.

Lastly, a pixel signal alone can then be detected by removing only the dark level from the sum of the pixel signal and the dark level. Specifically, the charge acquired in the photoelectric conversion units 334 (second photoelectric conversion unit) of low sensitivity is held in the in-pixel memories 336 (second in-pixel memory) for global shutter, and is thereafter read while CDS is performed using the in-pixel memories 335. Performing thus CDS allows reducing the influence of the dark level and allows enhancing ranging precision.

As described above, CDS as well is performed, in addition to global shutter, in the ranging pixels 330. In particular, a characterizing feature herein is that CDS is performed only for the signal acquired in photoelectric conversion units of relatively low sensitivity, which are prone to drops in ranging precision due to noise.

Generally, two memories are required to combine both global shutter and CDS, namely a charge-holding memory, in order to perform global shutter, and a memory for dark level reading, in order to perform CDS while holding charge. Accordingly, four memories are required in a simple operation flow in a case where global shutter and CDS are combined in ranging pixels each having two photoelectric conversion units. This increase in the number of necessary memories entails a smaller aperture ratio in the photoelectric conversion units as well as limitations in wiring layout.

In the ranging pixels 330, however, CDS is performed only for the signal acquired in photoelectric conversion units of relatively low sensitivity, so that, as a result, global shutter and CDS can be combined while the number of memories remains at two. By adopting the above configuration, the ranging precision for a dark subject can be enhanced while enhancing also the ranging precision for a subject that is moving at high speed.

<Sensitivity Differences Derived from Pixel Structure>

Figure 23A:
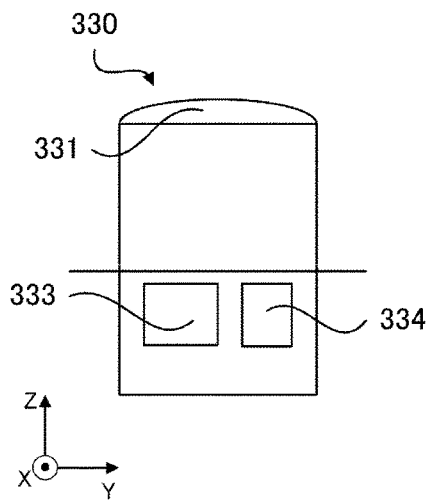
FIGS. 23A-23D illustrate variations of a ranging pixel.
Figure 23B:
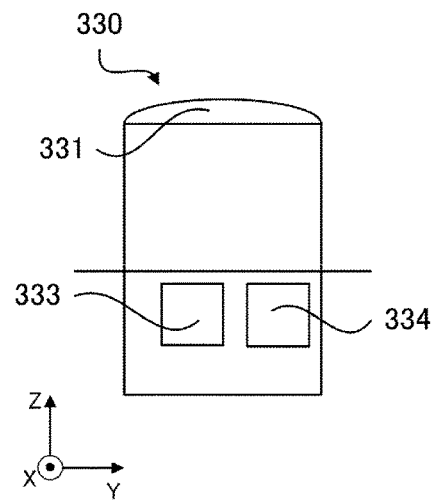
Figure 23C:
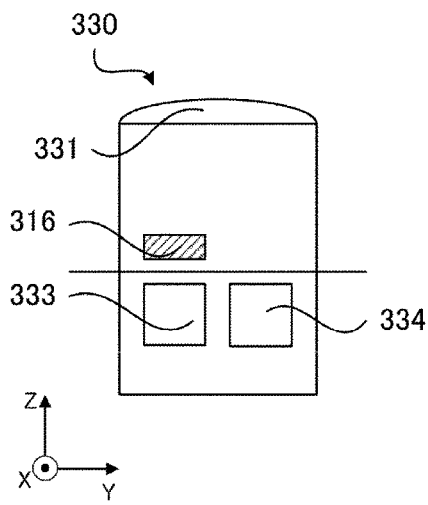
Figure 23D:
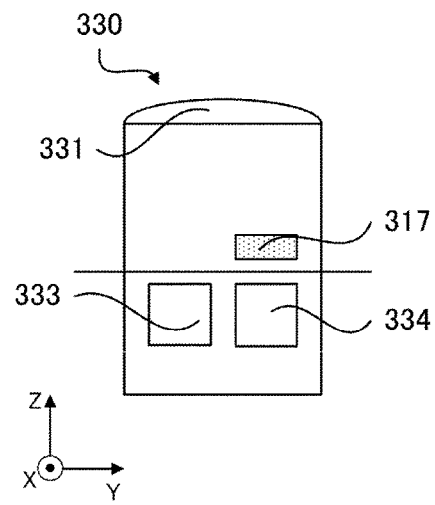

In order to provide a difference in sensitivity between the photoelectric conversion unit 333 and the photoelectric conversion unit 334 it suffices for instance to impart the pixel structure with asymmetry with respect to the plane perpendicular to the incident light beam separation direction (Y direction). FIG. 23(a) is an example wherein the aperture ratio of a photoelectric conversion unit is set to be asymmetrical, to render the sensitivity of the photoelectric conversion unit 333 higher than that of the photoelectric conversion unit 334. FIG. 23(b) is an example where the optical axis of a micro-lens 331 and the centers of the photoelectric conversion units are offset in the +Y direction, to render the sensitivity of the photoelectric conversion unit 333 on the −Y direction side higher than that of the photoelectric conversion unit 334 on the +Y direction side. Similarly, FIG. 23(c) is an example where a light guide section 316 is provided above the photoelectric conversion unit 333, to render thereby the sensitivity of the photoelectric conversion unit 333 higher than that of the photoelectric conversion unit 334. FIG. 23(d) is an example where an absorption section 317 is provided above the photoelectric conversion unit 334, to render thereby the sensitivity of the photoelectric conversion unit 333 higher than that of the photoelectric conversion unit 334.

The photoelectric conversion unit of relatively high sensitivity is known beforehand, in a case where a sensitivity difference is thus intentionally provided between the photoelectric conversion units 333 and 334, and thus a corresponding reading circuit can be accordingly used. As illustrated in FIG. 21 and FIG. 22, an amplification transistor, a select transistor and a vertical signal line connected to the in-pixel memory 336 are not used, and can accordingly be omitted, in a case where, for instance, the sensitivity of the photoelectric conversion unit 333 is higher than that of the photoelectric conversion unit 334.

<Sensitivity Differences Derived from Pixel Arrangement>

Sensitivity differences arise between the photoelectric conversion units 333 and 334 depending also on the characteristics of the imaging optical system. Generally, the exit pupil position of the imaging optical system 101 varies depending on the zoom and the focus state, and accordingly the designed pupil position of the solid-state image sensor 310 and the exit pupil position of the imaging optical system do not necessarily match each other. In a case where the designed pupil position of the imaging element and the exit pupil position of the imaging optical system are different, the eccentricity of the pupil region that is traversed by the light beam received in the ranging pixels varies with the position of each ranging pixel within the imaging element. When such eccentricity is large, a difference arises between pupil transmittance distributions of the light beams that form the two ranging images. Vignetting as well gives rise to a difference also between the pupil transmittance distributions of the light beams that form two ranging images.

Figure 24B:
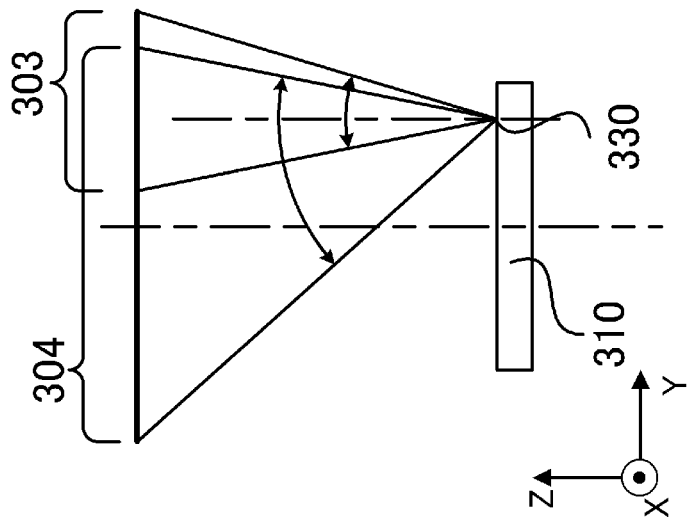
FIGS. 24A, 24B illustrate differences in pupil transmittance.
Figure 24A:
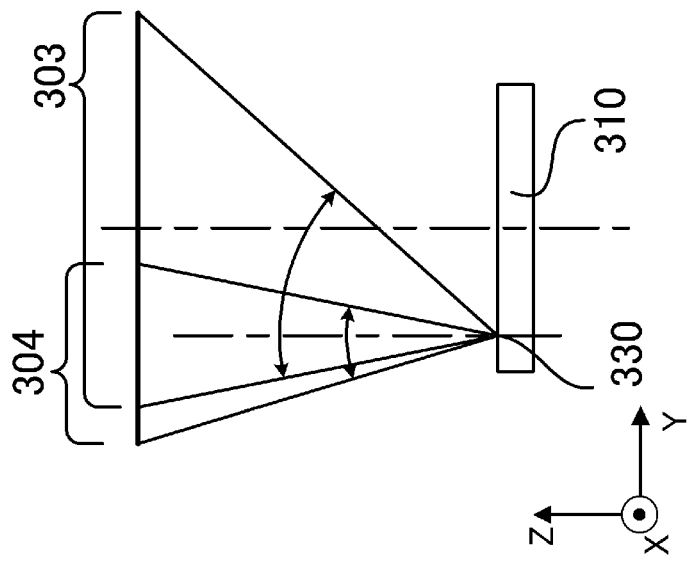

FIG. 24 illustrates a case where the exit pupil position of the imaging optical system stands closer than the designed pupil position of the solid-state image sensor 310 (in a case, for instance, of imaging at the wide-angle side of a zoom lens). FIG. 24(a) illustrates a state of a light beam that is received in a ranging pixel 330 in the peripheral region, in the −Y direction, of the solid-state image sensor 310. The photoelectric conversion unit 333 receives a light beam in the +Y direction pupil region 303, while the photoelectric conversion unit 334 receives a light beam from the pupil region 304 in the −Y direction. As FIG. 24(a) illustrates, the light beam divergence angle from the pupil region 303 is larger than the light beam divergence angle from the pupil region 304. Therefore, the sensitivity of the photoelectric conversion unit 333 is higher than that of the photoelectric conversion unit 334 in the peripheral region, in the −Y direction, of the solid-state image sensor.

Similarly, FIG. 24(b) illustrates a state of a light beam that is received in a ranging pixel 330 in the peripheral region, in the +Y direction, of the solid-state image sensor 310. As FIG. 24(b) illustrates, the light beam divergence angle from the pupil region 304 is larger than the light beam divergence angle from the pupil region 303. Therefore, the sensitivity of the photoelectric conversion unit 334 is higher than that of the photoelectric conversion unit 333 in the peripheral region, in the +Y direction, of the solid-state image sensor.

In some instances, the magnitude relationship between the sensitivities of the photoelectric conversion unit 333 and the photoelectric conversion unit 334 varies according to the position of the ranging pixels 330 in the solid-state image sensor 310, depending on the characteristics of the imaging optical system. In this case, it suffices to modify the photoelectric conversion unit that performs CDS depending on the position of the ranging pixel 330.

In a case where sensitivity differences arise on account of differences between the exit pupil position of the imaging optical system and the pupil position of the solid-state image sensor, in particular, the magnitude relationship between sensitivities reverses at a boundary that is a straight line running through the center of the solid-state image sensor and that is perpendicular to the pupil division direction. Accordingly, it suffices to swap the photoelectric conversion unit that performs CDS at a boundary that is a straight line running through the center of the solid-state image sensor and that is perpendicular to the pupil division direction. In FIG. 12, for instance, it suffices to perform CDS for the photoelectric conversion unit 334 in the peripheral region, in the −Y direction, of the solid-state image sensor 310, and to perform CDS for the photoelectric conversion unit 333 in the peripheral region, in the +Y direction.

The photoelectric conversion unit of relatively high sensitivity can be grasped beforehand also in a case where a magnitude relationship of sensitivity between the photoelectric conversion unit 333 and the photoelectric conversion unit 334 is determined by the characteristics of the imaging optical system. For instance, if the designed pupil position of the solid-state image sensor is set at infinity, then the pupil position of the imaging optical system stands necessarily closer than the pupil position of the solid-state image sensor. Accordingly, the sensitivity of the photoelectric conversion unit 333 is higher in the peripheral region in the −Y direction, and the sensitivity of the photoelectric conversion unit 334 is higher in the peripheral region in the +Y direction. If the photoelectric conversion unit of relatively high sensitivity is known, then a corresponding reading circuit can be accordingly used, as described above.

Embodiment 4

A solid-state image sensor 410 described in Embodiment 4 differs from the solid-state image sensor 110 described in Embodiment 1 with regard to the arrangement of the ranging pixels. FIG. 25 illustrates ranging pixels 420 (first ranging pixels) that perform pupil division in the X direction (row direction), and ranging pixels 430 (second ranging pixels) that perform pupil division in the Y direction (column direction), disposed within the solid-state image sensor 410. As the figure indicates, the ranging pixels 430 are disposed every other row of the solid-state image sensor 410, and there are rows in which the ranging pixels 430 are not provided.

Thus, global shutter may be used in all pixels of the pixel columns that include the ranging pixels 430 in a case where the ranging pixels 420 are disposed simultaneously in pixel columns that include ranging pixels 430. In pixel columns that include ranging pixels 430, global shutter may be used in the ranging pixels 430 alone, by modifying the operation of the ranging pixels 420 and the ranging pixels 430.

In a case where global shutter is used in all pixels of a pixel column that includes the ranging pixels 430, the exposure timing in ranging pixels 420 in pixel columns that include ranging pixels 430 is different from the exposure timing of ranging pixels 420 in pixel columns that include no ranging pixel 430 and that are disposed on a same row as that of the former ranging pixels 420. Preferably, therefore, ranging is performed using any one from among the ranging pixels 420 in pixel columns that include ranging pixels 430 and ranging pixels 420 in pixel columns that do not include ranging pixels 430. Ranging precision may be enhanced by performing ranging individually in ranging pixels 420 in pixel columns that include ranging pixels 430, and ranging pixels 420 in pixel columns that do not include ranging pixels 430, and by comparing then the two results.

If global shutter is used in the ranging pixels 430 alone, then the exposure timings of ranging pixels 420 in pixel columns that include no ranging pixels 430, and of ranging pixels 420 in pixel column that include ranging pixels 430 and that are disposed on the same row as the former ranging pixels 420, can be rendered simultaneously. Accordingly, it becomes possible to perform ranging by using simultaneously both ranging pixels 420 in pixel columns that include ranging pixels 430 and ranging pixels 420 in pixel columns that do not include ranging pixels 430. This is preferable in that, as a result, the sampling pitch becomes finer, and ranging precision is enhanced.

<Exposure Time Change>

In a case where the ranging pixels 430 are not disposed in all the rows, the exposure time can be caused to vary between the rows in which ranging pixels 430 are disposed and the rows in which only the ranging pixels 420 are disposed. This is preferable in that, as a result, ranging precision is enhanced, the quality of the images acquired in the ranging pixels is improved, and it becomes possible to acquire more accurate subject motion information.

An instance will be explained first where the exposure time of rows in which ranging pixels 430 are disposed is set to be longer than the exposure time of rows in which ranging pixels 420 alone are disposed. As described above, the ranging pixels 430 each have an in-pixel memory for performing global shutter, and accordingly the aperture ratio of the ranging pixels 430 may be lower than that of the ranging pixels 420. It becomes thus possible to enhance the ranging precision for a dark subject, even with ranging using ranging pixels 430 of low aperture ratio, in a case where the exposure time at rows in which ranging pixels 430 are disposed is set to be longer than that of rows in which only ranging pixels 420 are disposed.

An instance will be explained next where the exposure time of rows in which ranging pixels 430 are disposed is set to be shorter than the exposure time of rows in which ranging pixels 420 alone are disposed. As described above, subject motion information can be acquired by comparing an image acquired in the ranging pixels 420 and an image acquired in the ranging pixels 430. In a case where the exposure time of rows in which ranging pixels 430 are disposed is set to be shorter than that of rows in which ranging pixels 420 alone are disposed, the images acquired in the ranging pixels 430 are images that reflect more accurately a static subject. Subject motion information can be acquired more accurately as a result.

In both instances, images of different exposure times can be acquired in the ranging pixels 420 in rows in which ranging pixels 430 are disposed and ranging pixels 420 in rows in which no ranging pixels 430 are disposed. As a result, it becomes possible to enhance the ranging precision for a subject of large contrast ratio, in ranging utilizing the ranging pixels 420. Further, the dynamic range of the captured image can be expanded by using pixel signals that are acquired in ranging pixels 420 of dissimilar exposure time.

Embodiment 5

A solid-state image sensor 510 described in Embodiment 5 differs from the solid-state image sensor 110 described in Embodiment 1 as regards the configuration and the operation method of the ranging pixels.

Figure 26:
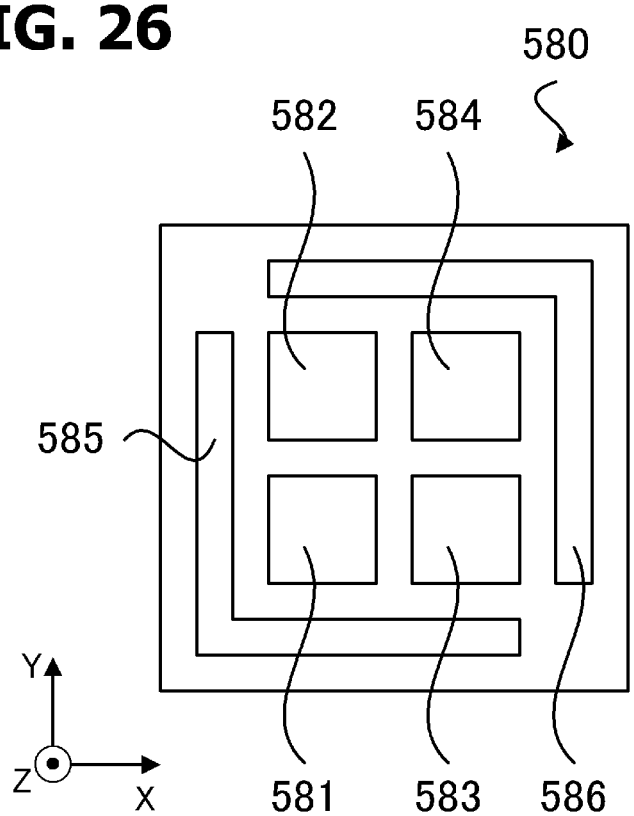
FIG. 26 illustrates a ranging pixel in a solid-state image sensor according to Embodiment 5.
Figure 27:
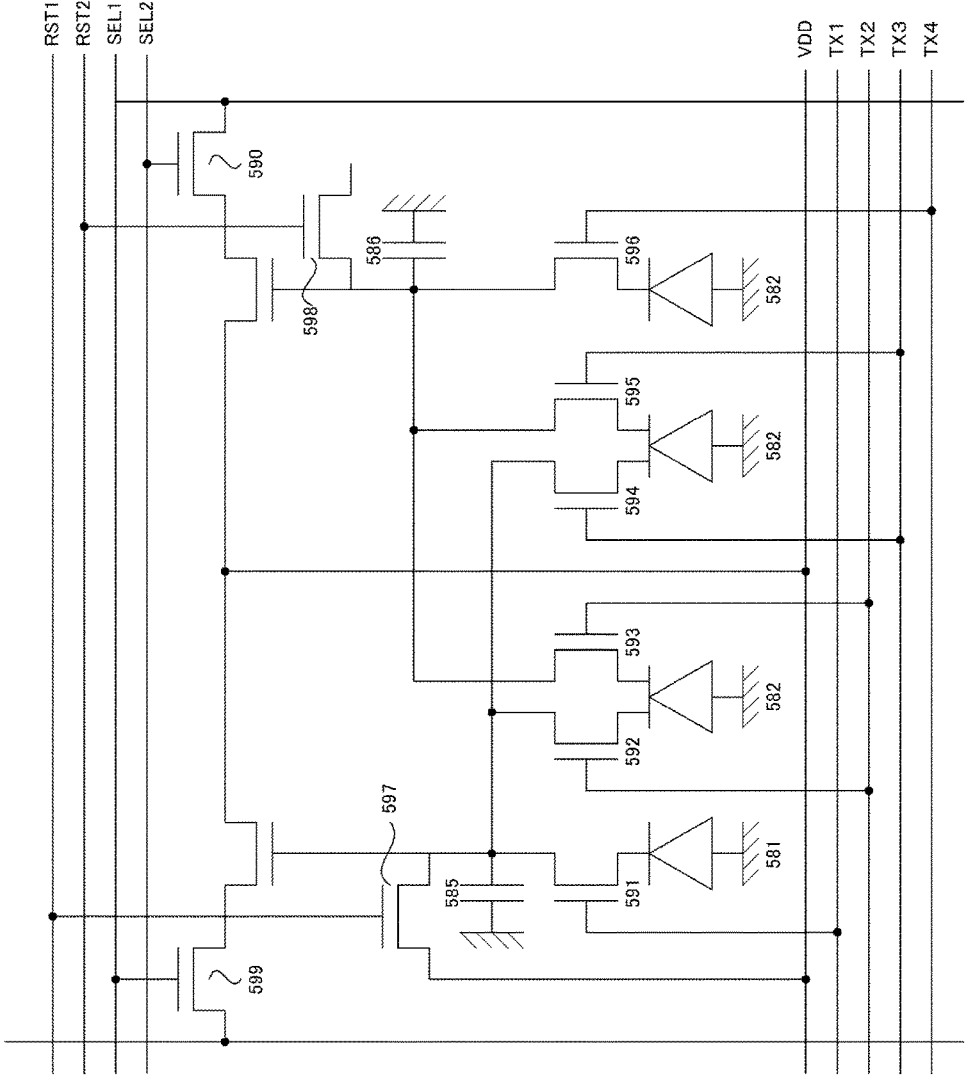
FIG. 27 illustrates a circuit diagram of a ranging pixel in the solid-state image sensor according to Embodiment 5.

FIG. 26 is a diagram for explaining the configuration of a ranging pixel 580 in the solid-state image sensor 510. FIG. 27 is a circuit diagram of the ranging pixel 580. The ranging pixel 580 has four photoelectric conversion units 581, 582, 583, 584, disposed over two rows and two columns, and in-pixel memories 585, 586. The photoelectric conversion unit 581 is configured to acquire a light beam from the pupil region in the +X and +Y directions, within the pupil region of the imaging optical system. Similarly, the photoelectric conversion unit 582 is configured to acquire a light beam from the +X and −Y directions, the photoelectric conversion unit 583 is configured to acquire a light beam from the −X and +Y directions, and the photoelectric conversion unit 584 is configured to acquire a light beam from the −X and −Y directions.

The ranging pixel 580 can operate in both a first ranging mode in which an incident light beam is acquired by being separated in the X direction (row direction), and a second ranging mode in which an incident light beam is acquired by being separated in the Y direction (column direction). In the first ranging mode of acquiring an incident light beam through separation in the row direction, ranging is performed by comparing a sum of the signals acquired in the photoelectric conversion units 581 and 582 lined up in a first column, and a sum of signals acquired in the photoelectric conversion units 583 and 584 lined up in a second column. In the second ranging mode in which an incident light beam is acquired by being separated in the column direction, ranging is performed by comparing a sum of the signals acquired in the photoelectric conversion units 581 and 583 that are lined up in a first row, and a sum of signals acquired in the photoelectric conversion units 582 and 584 that are lined up in a second row.

In the first ranging mode, signals are read with rolling shutter, and in the second ranging mode signals are read with global shutter. By adopting the above configuration, ranging precision for a subject that is moving at high speed can be enhanced, while reducing power consumption, as compared with an instance where global shutter is used in both the first and the second ranging mode. In particular, ranging precision for a dark subject can be enhanced by changing the roles of the in-pixel memories in the first ranging mode and the second ranging mode, as described above.

<First Ranging Mode>

Figure 28:
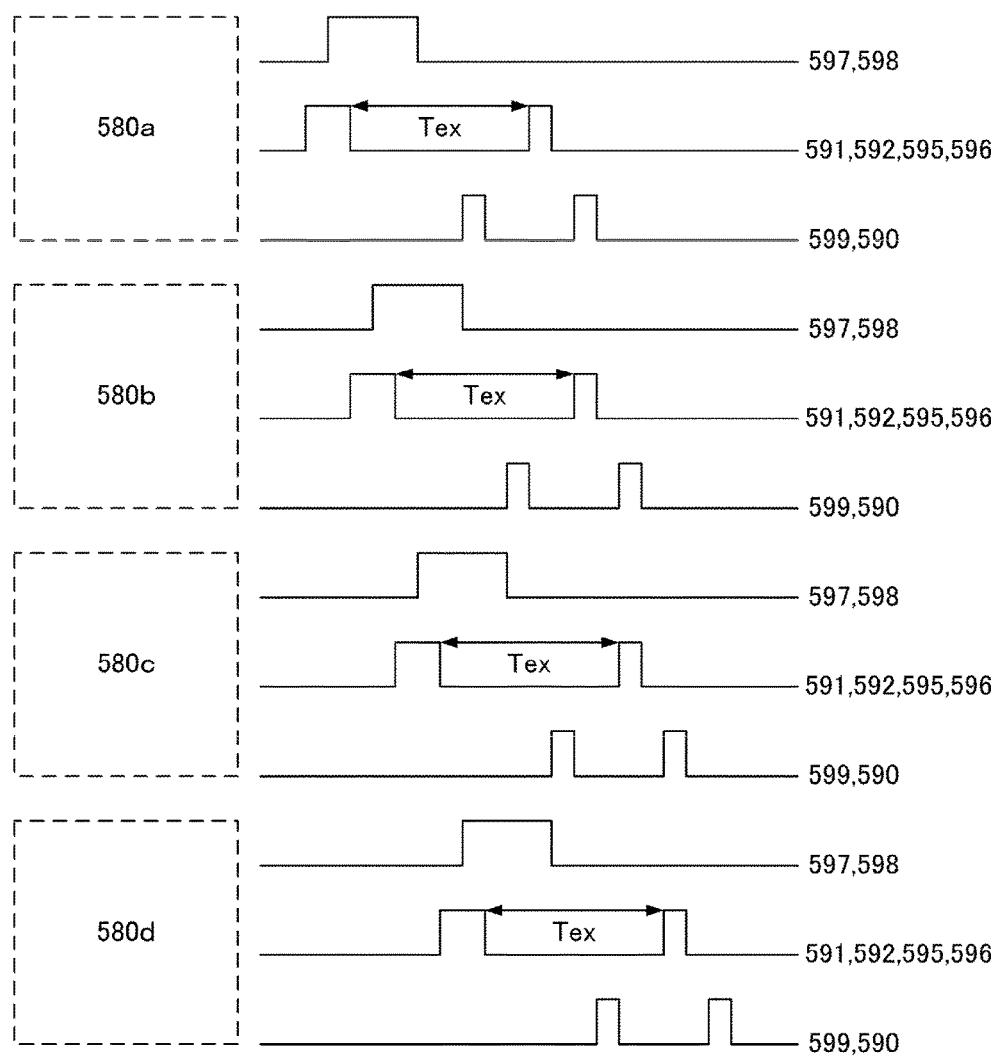
FIG. 28 illustrates an operation flow of a first ranging mode according to Embodiment 5.

The operation flow of the ranging pixel 580 at the time of the first ranging mode will be explained next with reference to FIG. 28. The basic operation thus far is identical to that in the operation flow of the ranging pixels 220 illustrated in FIG. 18 and FIG. 19. Firstly, TXs 591, 592, 595, 596 and the RSTs 597, 598 are turned on, to reset thereby the photoelectric conversion units 581, 582, 583, 584 and the in-pixel memories 585, 586. Next, the TXs 591, 592, 595, 596 are turned off, sequentially from the top row of the solid-state image sensor 510, to start thereby charge accumulation. After turn-off of the RSTs 597, 598, SELs 599, 590 are turned on, sequentially from the top row of the solid-state image sensor 510, to transfer thereby dark level signals of the in-pixel memories 585, 586 to the peripheral circuit. Next, the TXs 591, 592, 595, 596 are turned on, sequentially from the top row of the solid-state image sensor 510, to thereby transfer charge accumulated in the photoelectric conversion units 581, 582 to the in-pixel memory 585, and transfer charge accumulated in the photoelectric conversion units 583, 584 to the in-pixel memory 586. The TXs are turned off, to separate thereby the photoelectric conversion units and the in-pixel memories, after which the SELs 599, 590 are turned on, sequentially from the top row of the solid-state image sensor 510, to transfer thereby pixel signals and a dark level signal to the peripheral circuit. It becomes then possible to detect the pixel signal alone by lastly taking the difference between the sum of the pixel signal plus the dark level, and the dark level signal. That is, the signals are read according to rolling shutter and CDS in the first ranging mode.

<Second Ranging Mode>

Figure 29:
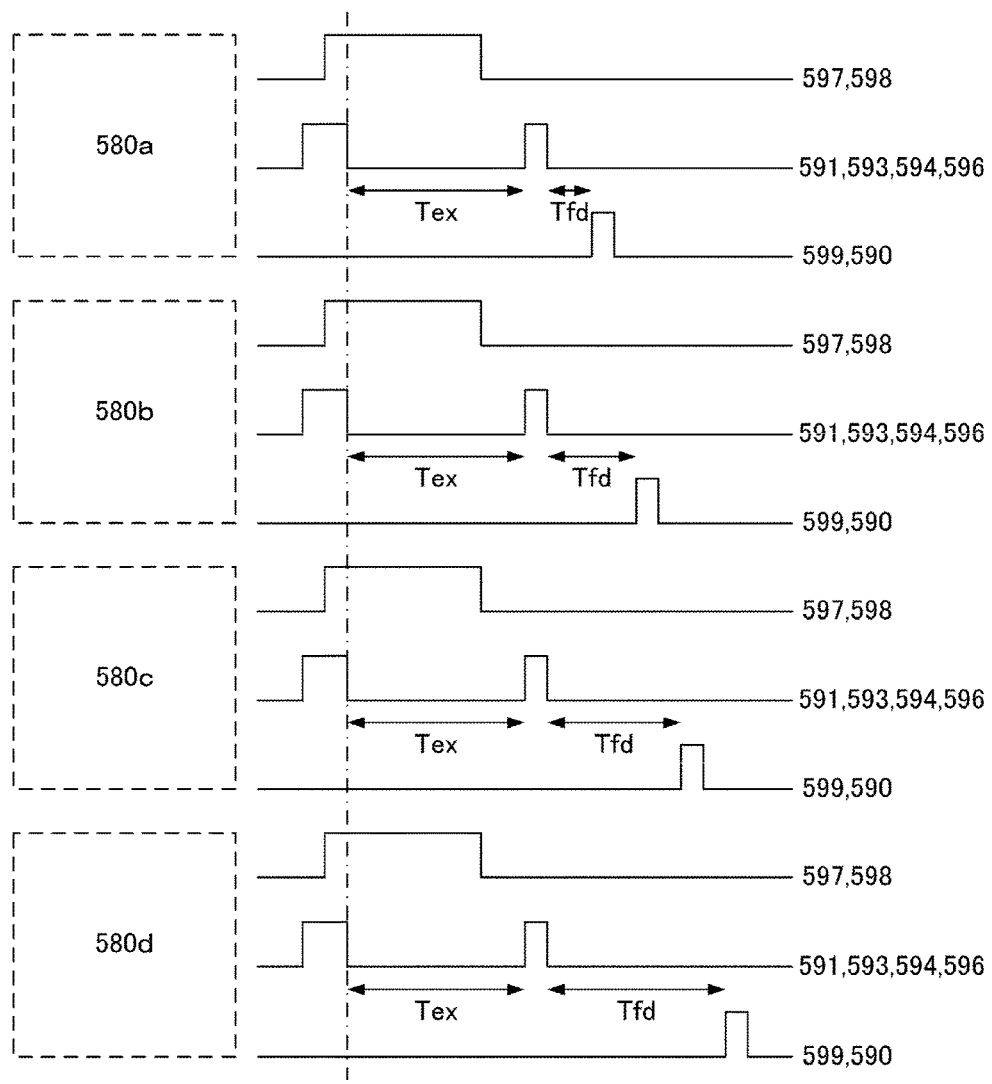
FIG. 29 illustrates an operation flow of a second ranging mode according to Embodiment 5.

The operation flow of the ranging pixel 580 during the second ranging mode will be explained next with reference to FIG. 29. The basic operation thus far is identical to that in the operation flow of the ranging pixels 130 illustrated in FIG. 7 and FIG. 8. Firstly, the TXs 591, 593, 594, 596 and the RSTs 597, 598 are turned on, to reset thereby the photoelectric conversion units 581, 582, 583, 584 and in-the pixel memories 585, 586. Next, the TXs 591, 593, 594, 596 of all rows are turned off simultaneously, to start thereby charge accumulation. After the RSTs 597, 598 have been turned off, the TXs 591, 593, 594, 596 of all rows are turned on simultaneously, to thereby transfer charge accumulated in the photoelectric conversion units 581, 583 to the in-pixel memory 585, and transfer the charge accumulated in the photoelectric conversion units 582, 584 to the in-pixel memory 586. After transfer, the TXs are turned off, to thereby separate the photoelectric conversion units and in-pixel memories, and hold charge in the in-pixel memories 585, 586. Lastly, the SELs 599, 590 are turned on, sequentially from the top row of the solid-state image sensor 510, to transfer thereby the pixel signal to the peripheral circuit. In the second ranging mode, thus, signals detection is performed according to global shutter.

<Effect of the Present Embodiment>

The roles of the in-pixel memories of the ranging pixels in the solid-state image sensor 510 are swapped between the first ranging mode and the second ranging mode. The problem of decreased drop in ranging precision for an object that is moving at high speed arises herein in a case where the signals are read with rolling shutter in the second ranging mode where an incident light beam is acquired by being separated in the Y direction (column direction). Therefore, the ranging precision for an object moving at high speed can be enhanced by using the in-pixel memories with global shutter, in the second ranging mode. In the first ranging mode where an incident light beam is acquired by being separated in the X direction (row direction), by contrast, the drop in ranging precision for an object moving at high speed is small, even when signals are read. Therefore, the ranging precision for a dark subject in particular can be enhanced, through the use of the in-pixel memories in CDS, in the first ranging mode.

<Variation of the Signal Reading Scheme>

Herein, examples have been illustrated in which charge within the photoelectric conversion units is transferred individually by respective transfer transistors, but respective gate electrodes may be provided between the photoelectric conversion units, such that charge is transferred after connection of the plurality of photoelectric conversion units. Further, global shutter and CDS may be combined for signals from photoelectric conversion units of relatively low sensitivity, during the second ranging mode, using the method described in Embodiment 3. Specifically, a signal is read after transfer, to a corresponding in-pixel memory, of charge that is acquired in the photoelectric conversion unit of a row of higher sensitivity (in the row as a whole), from among the photoelectric conversion units lined up in a first row and the photoelectric conversion units lined up in a second row. On the other hand, it suffices to read a signal after CDS is performed using the other in-pixel memory, after transfer of charge acquired in the photoelectric conversion unit of a row of relatively low sensitivity, to a corresponding memory.

<In-Pixel Memory Sharing>

FIG. 26 illustrates an instance of two in-pixel memories for four photoelectric conversion units, but the number of in-pixel memories may be one, instead of two. In the case of one in-pixel memory, it suffices to perform rolling shutter and CDS by resorting to the same flow as that of the ranging pixels 220 illustrated in FIG. 20, in the first ranging mode. In the second ranging mode, it suffices to perform global shutter using the same flow as that of the ranging pixels 130 illustrated in FIG. 11. Preferably, the number of in-pixel memories is small, since this allows increasing the aperture ratio of the photoelectric conversion units, and, in particular, enhancing the ranging precision for a dark subject.

(Other Variations)

<Variation the of Pupil Division Direction>

In the above embodiments, examples of ranging pixels have been explained in which the pupil division direction is the X direction (row direction), and in which the pupil division direction is the Y direction (column direction), but the pupil division direction may be an oblique direction. In this case, rolling shutter is used for first ranging pixels in which an incident light beam is detected through separation in a first direction that forms a relatively large angle with the column direction. On the other hand, global shutter is used for second ranging pixels in which an incident light beam is detected through separation in a second direction that forms a smaller angle with the column direction than that formed by the first direction. That is because the smaller the angle formed with the column direction in which signals are read, the larger is the extent of decrease of ranging precision when a subject that is moving at high speed is imaged with rolling shutter. Preferably, however, the pupil division direction is the row direction and column direction, for the reasons given below.

Firstly, the extent of decrease of ranging precision when the subject that is moving at high speed is captured with rolling shutter is smallest in an instance where the pupil division direction is the row direction. Secondly, the closer to the vertical that is the angle formed by different ranging pixels with the pupil division direction, the greater the extent of ranging that can be performed independently from the direction of the brightness value change of the subject. Thirdly, a combination of the pixel array direction and the pupil division direction yields a finer sampling pitch, and, accordingly, ranging precision.

<Variation of Global Shutter>

Exposure timings need not necessarily be made simultaneous, using global shutter, in ranging pixels the pupil division direction whereof is the Y direction (column direction). Even if exposure timings are not exactly simultaneous, it suffices that the differences between exposure timings be smaller than those of rolling shutter, in ranging pixels of different rows. In a case where, for instance, signals are read sequentially from the top row, it suffices specifically to set the charge retention time at the in-pixel memories to be longer the lower the row is at which the ranging pixels are positioned. Preferably, however, the difference between exposure timings at different rows is small, and therefore it is preferable to use global shutter, in which exposure timings of the ranging pixels at different rows are all exactly the same.

<Variation of the Pupil Division Method>

Figure 30A:
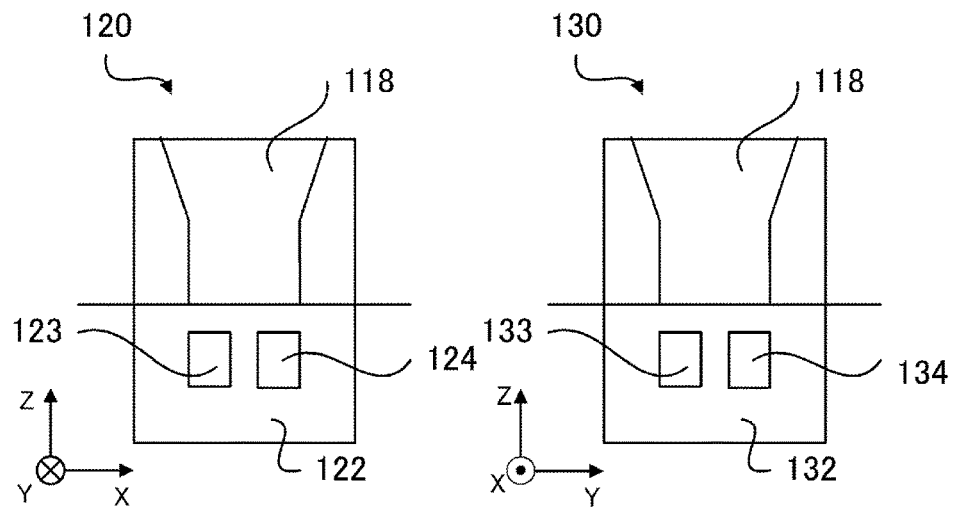
FIGS. 30A, 30B illustrate variations of ranging pixels.
Figure 30B:
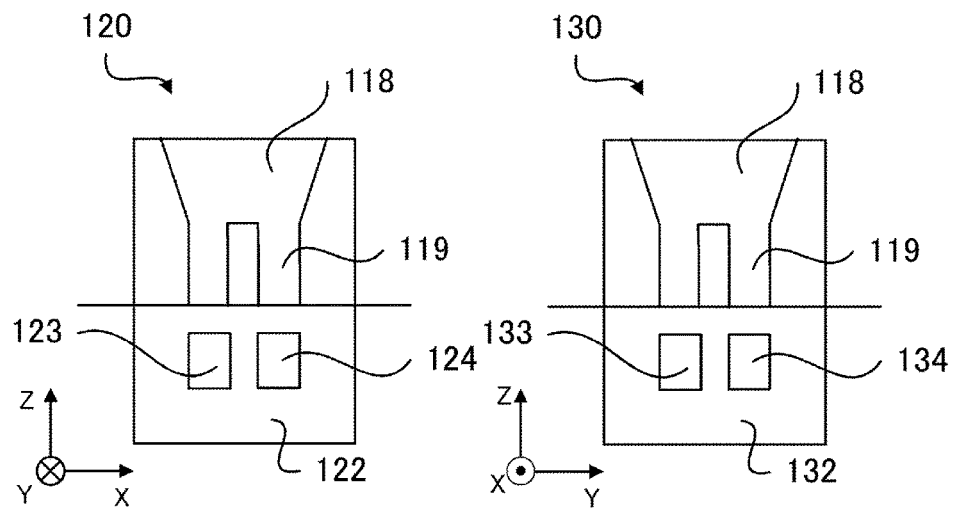

A method relying on micro-lenses has been resorted to above as the method for pupil division, but the method is not limited thereto. For instance, division may be accomplished by resorting to a waveguide mode using a waveguide 118, as illustrated in FIG. 30(a). A dominant waveguide mode of coupling of light that strikes the waveguide through the first pupil region is different from a dominant waveguide mode of coupling of light that strikes the waveguide through the second pupil region. Accordingly, a light beam having passed through the first pupil region can be selectively guided to a first photoelectric conversion unit and a light beam having passed through the second pupil region can be selectively guided to the second photoelectric conversion unit. As illustrated in FIG. 30(b), the waveguide 118 for pupil division and a waveguide 119 for guiding light to photoelectric conversion units may be used. Alternatively, a micro-lens and a waveguide may be used simultaneously. Using a waveguide allows for more efficient guiding of light that has struck the pixel towards the photoelectric conversion units, allows achieving a ranging image of better quality, and affords thus ranging of higher precision.

A color filter may be provided between the micro-lens and the substrate, to acquire simultaneously color information. The ranging pixels may be provided in pixels of a specific color alone, or in pixels of a plurality of colors. In a case where the ranging pixels are provided in pixels of a plurality of plurality of colors, high-precision ranging can be performed by using color information on the subject as acquired in the ranging pixels.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-013377, filed on Jan. 28, 2014 Japanese Patent Application No. 2014-187752, filed on Sep. 16, 2014, and Japanese Patent Application No. 2014-187753, filed on Sep. 16, 2014 which are hereby incorporated by reference herein in their entirety.

REFERENCE SIGNS LIST

110: Solid-state image sensor
120: First ranging pixel
130: Second ranging pixel
135, 136: In-pixel memory

The invention claimed is:

1. A solid-state image sensor comprising:
a plurality of first pixels, each first pixel including a plurality of photoelectric conversion portions arranged in a row direction; and
a plurality of second pixels, each second pixel including a plurality of photoelectric conversion portions arranged in a column direction,
wherein the plurality of first pixels and second pixels are disposed in the form of a matrix, and signals from the plurality of first pixels and second pixels are output for each row,
each of the plurality of second pixels has at least one in-pixel memory which holds charge obtained by the plurality of photoelectric conversion portions, and each of the plurality of first pixels does not have an in-pixel memory.

2. The solid-state image sensor according to claim 1, further comprising:
a driving circuit that drives the plurality of second pixels to output signals according to charges held in the in-pixel memories for each row.

3. The solid-state image sensor according to claim 2, wherein the driving circuit drives the plurality of first pixels and second pixels such that a difference in exposure timings of the plurality of second pixels disposed in mutually different rows is made smaller than a difference in exposure timings of the plurality of first pixels disposed in mutually different rows, by causing to vary, for each row, a time over which charges are held in the in-pixel memories, between second pixels disposed in different rows.

4. The solid-state image sensor according to claim 1, wherein exposure timings of second pixels disposed in different rows are simultaneous.

5. The solid-state image sensor according to claim 1, wherein an aperture ratio of the photoelectric conversion portions in the first pixels is larger than an aperture ratio of the photoelectric conversion portions in the second pixels.

6. The solid-state image sensor according to claim 1, wherein the at least one in-pixel memory is disposed so as to straddle respective boundaries between adjacent first pixels and second pixels.

7. The solid-state image sensor according to claim 1, wherein the second pixels have a first photoelectric conversion portion, a second photoelectric conversion portion of lower sensitivity than that of the first photoelectric conversion portion, a first in-pixel memory, and a second in-pixel memory.

8. The solid-state image sensor according to claim 7, wherein the structure of the second pixels is asymmetrical with respect to a plane that is perpendicular to the second direction.

9. The solid-state image sensor according to claim 7, wherein the arrangements of the first photoelectric conversion portion and of the second photoelectric conversion portion are reversed at a boundary which is a straight line that runs through the center of the solid-state image sensor and that is perpendicular to the second direction.

10. The solid-state image sensor according to claim 1, wherein each of the first pixels has at least four photoelectric conversion portions.

11. The solid-state image sensor according to claim 1, wherein rows with no second pixels are provided.

12. The solid-state image sensor according to claim 11, wherein exposure time differs between rows that include second pixels and rows that include no second pixels.

13. The solid-state image sensor according to claim 12, wherein the exposure time in rows that include second pixels is longer than that of rows that include no second pixels.

14. The solid-state image sensor according to claim 12, wherein the exposure time in rows that include second pixels is shorter than that of rows that include no second pixels.

15. A ranging apparatus comprising:
the solid-state image sensor according to claim 1;
an imaging optical system;
and a processor.

16. An imaging apparatus, comprising the ranging apparatus according to claim 15.

* * * * *